United States Patent
Van Winkelhoff et al.

(10) Patent No.: US 8,885,429 B1
(45) Date of Patent: Nov. 11, 2014

(54) MEMORY DEVICE AND A METHOD FOR ERASING DATA STORED IN THE MEMORY DEVICE

(71) Applicant: ARM Limited, Cambridge (GB)

(72) Inventors: Nicolaas Klarinus Johannes Van Winkelhoff, Villard Bonnot (FR); Pierre Lemarchand, Grenoble (FR); Bastien Jean Claude Aghetti, Grenoble (FR); Virgile Javerliac, Grenoble (FR)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 13/915,918

(22) Filed: Jun. 12, 2013

(51) Int. Cl.
*G11C 7/00* (2006.01)
*G11C 29/52* (2006.01)

(52) U.S. Cl.
CPC . *G11C 29/52* (2013.01); *G11C 7/00* (2013.01)
USPC ........................................................ 365/218

(58) Field of Classification Search
CPC .... G11C 134/0069; G11C 16/08; G11C 7/22; G11C 11/418; G11C 11/419; G11C 16/16; G11C 7/1045; G11C 8/12
USPC ............ 365/230.03, 230.06, 185.11, 185.12, 365/185.13, 185.23, 185.29, 218
See application file for complete search history.

(56) References Cited

U.S. PATENT DOCUMENTS 6,333,892 B2 * 12/2001 Hamamoto et al. ..... 365/230.01

* cited by examiner

*Primary Examiner* — Thong Q Le
(74) *Attorney, Agent, or Firm* — Nixon & Vanderhye P.C.

(57) ABSTRACT

A memory device including an array of memory cells arranged as a plurality of rows and columns. Write circuitry then controls a voltage level of the associated at least one bit line for each of the addressed memory cells to cause write data to be written into the addressed memory cells. In the presence of an asserted erase signal, a decoder circuitry's operation is modified such that it issues, independently of the clock signal, an asserted word line signal on the word line associated with each row in a predetermined erase region of the array. Further, the write circuitry's operation is modified so that it controls the voltage level of the associated at least one bit line for each memory cell in the predetermined erase region, in order to cause erase write data to be written into the memory cells of the predetermined erase region.

22 Claims, 13 Drawing Sheets

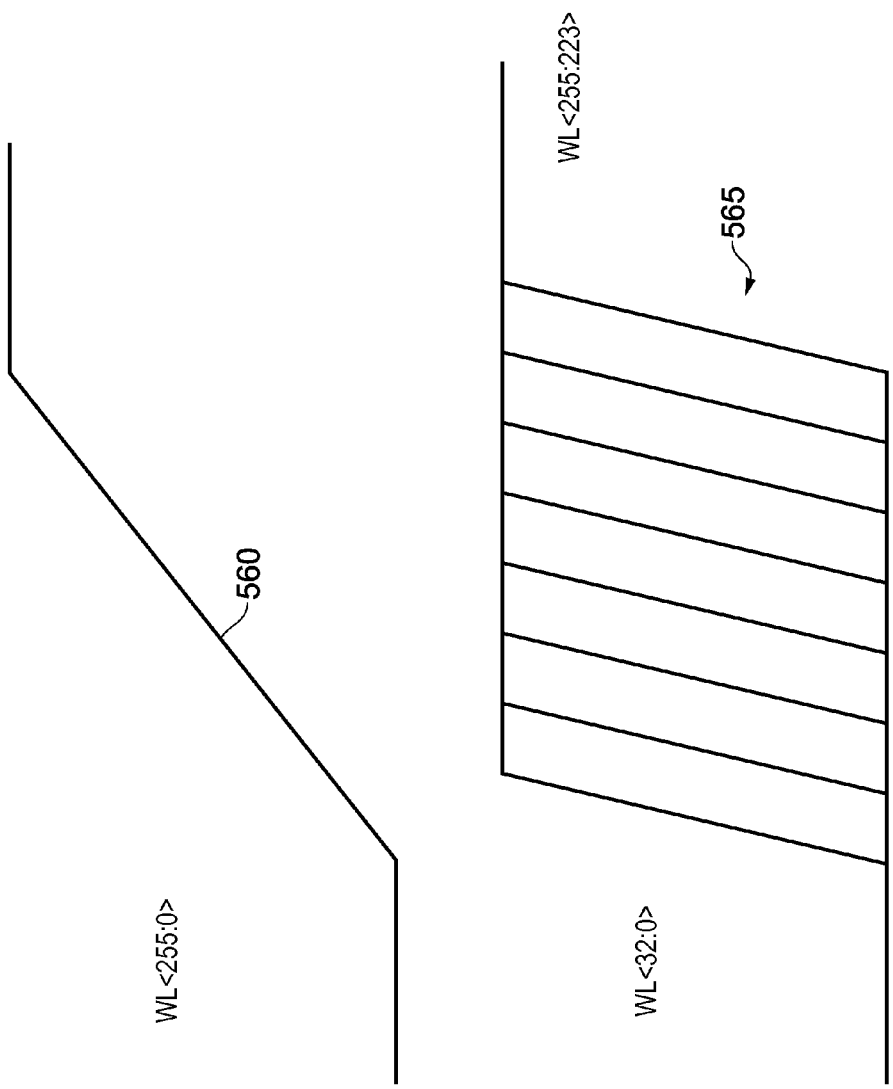

MEMORY DEVICE AND A METHOD FOR ERASING DATA STORED IN THE MEMORY DEVICE

BACKGROUND OF THE INVENTION

1. Field of the Invention

The present invention relates to a memory device, and to a method of operation of such a memory device in order to erase data stored within the memory device.

2. Description of the Prior Art

In a typical memory device comprising an array of memory cells arranged in rows and columns, data remanence may be observed since such a memory device often retains its last stored value even after the processing device using that memory device has no further need for that stored value, and hence the memory cells storing that value are available for overwriting with new data. Only once those memory cells have actually been overwritten with new data will the old data no longer be available in the memory device.

However, arranging the processing device to take positive steps to overwrite data within the memory device as soon as it has finished using that data has typically been considered to incur too much of a performance penalty, particularly where that data is stored within memory cells occupying multiple rows of the memory array, and accordingly a sequence of write operations would be required to overwrite the data one row at a time.

When the memory device is used to store sensitive data, it is hence more common to rely on software protection measures to ensure that that sensitive data is not accessed by applications that are not authorised to access it. However, it has been found that such software protection measures are prone to attack by hackers seeking to access that sensitive data.

For example, one known approach, often referred to as a cold boot attack, involves turning off the system incorporating the memory device and associated processing device, and then turning it on again. This allows the software protection measure to be circumvented. Under normal conditions, this would not be a problem, as removing the power supply to the memory device would typically result in the stored data being lost. However, it has been found that even after the power has been removed from the memory device, the information stored therein can remain for a prolonged period of time when special, external, conditions are applied, this providing another form of data remanence. One example of such a special external condition is to subject the memory device to a low temperature before removing the power. Under such conditions, once the power is restored, the software protection will have been circumvented, and the data may still be extracted from the memory device.

It would be desirable to provide an improved technique for preventing access to previously stored data in a memory device.

SUMMARY OF THE INVENTION

Viewed from a first aspect, the present invention provides a memory device comprising: an array of memory cells arranged as a plurality of rows and columns, each row of memory cells being coupled to an associated word line, and each column of memory cells being coupled to an associated at least one bit line; decoder circuitry configured to be responsive to a write operation to decode an address indication associated with the write operation in order to determine the row containing addressed memory cells for the write operation, and to issue, in dependence on a clock signal, an asserted word line signal on the associated word line for the determined row; and write circuitry configured to be responsive to said write operation to control a voltage level of the associated at least one bit line for each of said addressed memory cells to cause write data to be written into said addressed memory cells; the decoder circuitry being configured to be responsive to an asserted erase signal to issue, independently of said clock signal, said asserted word line signal on the word line associated with each row in a predetermined erase region of the array; and the write circuitry being configured to be responsive to said asserted erase signal to control the voltage level of the associated at least one bit line for each memory cell in said predetermined erase region, in order to cause erase write data to be written into the memory cells of said predetermined erase region; whereby the memory device is responsive to said asserted erase signal to trigger a forced write operation in respect of each memory cell within said predetermined erase region.

In accordance with the present invention, the normal operation of the decoder circuitry and write circuitry is modified upon receipt of an asserted erase signal. In particular, during a normal write operation, the decoder circuitry will typically assert a word line signal on a single word line associated with the row that contains the addressed memory cells for the write operation. However, in response to the asserted erase signal, the decoder circuitry issues an asserted word line signal on the word line associated with each row in a predetermined erase region of the array. Hence, if that predetermined erase region occupies multiple rows of the array, this will result in multiple word lines being activated. In addition, in the presence of the asserted erase signal, the decoder circuitry is configured to issue such asserted word line signals independently of the clock signal. This means that once the erase signal has been asserted, an asserted word line signal will be issued in respect of each row in the predetermined erase region irrespective of the state of the clock. Accordingly, a hacker will be unable to prevent this modified behaviour of the decoder circuitry merely by seeking to remove the clock signal from the memory device.

The write circuitry is then configured to be responsive to the asserted erase signal to control the voltage level on at least one bit line for each memory cell in the predetermined erase region, in order to cause erase write data to be written into the memory cells of the predetermined erase region. The erase write data can take a variety of forms. In some embodiments that erase write data may be predetermined, whilst in other embodiments such erase write data is instead generated randomly, or the write circuitry is used to merely write into the memory device the data currently present at the input pins of the memory device. Whatever the form of the erase write data, it will be used to positively overwrite the current data stored in the predetermined erase region. As a result, it can be seen that by such a mechanism the asserted erase signal is used to trigger a forced write operation in respect of each memory cell within the predetermined erase region in a clock independent manner.

As discussed above, such an approach can be used to improve the security of the memory device, and in particular prevent hackers from taking advantage of the earlier mentioned data remanence effects, by ensuring that data is overwritten in an efficient, and clock independent, manner. The predetermined erase region can take a variety of forms. For example, it may be chosen to be the entire memory array, or instead could be chosen to be a predetermined area of the array in which certain secure data is stored, for example encryption keys or parts of encryption keys, decipher results, etc. The predetermined erase region may occupy one or more rows of the memory array, and/or may occupy one or more columns of the memory array. However, the predetermined erase region is defined, the above-described mechanism provides a particularly efficient technique for erasing the data in that region, since it avoids the need for a separate write operation to be issued under software control for each row within the predetermined erase region. Instead, in response to the asserted erase signal, the decoder circuitry automatically asserts word line signals in respect of every row in the predetermined erase region. These word line signals can be asserted in parallel, and the same erase write data is written into every row within the predetermined erase region. As will be discussed in more detail later, in certain embodiments there can be a benefit to staggering the assertion of the word line signals slightly so that not all of the rows in the predetermined erase region are written to at exactly the same time. However, the same erase write data is still written into every row.

Whilst the above approach is particularly useful for protecting secure data from a hacking attack, the technique can also be used for other reasons not related to security. Purely by way of example, if the memory device takes the form of a cache memory comprising a tag array and a data array, each entry in the tag array typically comprises a valid bit to identify whether the corresponding cache line in the data array is valid or not. On a reset of the cache memory, each of the valid bits needs to be cleared, and typically this will involve issuing a separate write operation in respect of every tag entry, hence taking a significant amount of time to perform. However, in accordance with the present invention, a predetermined erase region can be defined to include the column of the array containing the valid flags for every tag entry, and when it is necessary to reset the cache, an asserted erase signal can be issued to cause the above described erase functionality to write the relevant bit value into each of the valid flags to identify those entries as being invalid (typically this involving writing a logic zero value into each of the valid flag positions).

In addition to the modified behaviour of the decoder circuitry and write circuitry being clock independent, in one embodiment the decoder circuitry and write circuitry are configured to be responsive to the asserted erase signal independent of a current operating state of the memory device at a time the erase signal is asserted. In particular, the current operating state may be any powered state of the memory device, and hence for example the memory device may be in a read state where it is performing a read operation, a write state where it is performing a write operation, an idle state where it is currently performing no operation, or a non-enabled state (for example where a chip enable signal is de-asserted in order to deselect the memory device). Irrespective of which operating state the memory device is in at the time the erase signal is asserted, the decoder circuitry and write circuitry will still operate in response to that asserted erase signal to perform the forced write operation discussed earlier in order to write erase write data into each memory cell of the predetermined erase region.

The decoder circuitry can take a variety of forms. However, in one embodiment the decoder circuitry comprises first stage decoding circuitry configured to generate a plurality of intermediate signals in response to the address indication, and further stage decoding circuitry configured to generate the asserted word line signal in dependence on values of the intermediate signals. The decoder circuitry is then configured to be responsive to the asserted erase signal to set the intermediate signals to values which will cause the further stage decoding circuitry to then issue the asserted word line signal on the word line associated with each row in the predetermined erase region.

Hence, in such embodiments, the decoder circuitry modifies its behaviour upon receipt of the asserted erase signal by manipulating the intermediate signals generated by the first stage decoding circuitry. By taking such an approach, the decoder circuitry is then able to deviate from its normal operation that would restrict it to asserting only a single word line signal at any point in time, to instead be able to assert multiple word line signals at a time. Whilst the required modification to the decoder circuitry could instead have been implemented in the further stage decoding circuitry, it has been found that a particularly efficient and low transistor count solution can be achieved by instead modifying the behaviour of the first stage decoding circuitry, and in particular the manner in which the intermediate signals are set by that first stage decoding circuitry. In particular, the circuits implementing the first stage decoding circuitry are typically very small compared with the circuits required to implement the further stage decoding circuitry, and are repeated only a small number of times even for relatively large sized memory devices. By providing a low transistor count solution, this can provide an extra level of secrecy, since the low transistor count makes the added circuitry very difficult to detect by hackers.

There are a number of ways in which the decoder circuitry can be arranged to issue asserted word line signals independently of the clock signal when it is operating in response to the asserted erase signal. In one embodiment, in the absence of said asserted erase signal, timing of operation of the further stage decoding circuitry is controlled by the clock signal, and the decoder circuitry is responsive to the asserted erase signal to control the timing of operation of the further stage decoding circuitry independently of said clock signal. Hence, in such embodiments, the operating of the further stage decoding circuitry is modified so that its operation is clock independent.

There are a number of ways in which the operation of the further stage decoding circuitry can be modified to achieve such clock signal independence. In one embodiment, the decoder circuitry further comprises clock generation circuitry configured, in the absence of the asserted erase signal, to generate an internal clock signal from the clock signal and to provide the internal clock signal to the further stage decoding circuitry. The clock generation circuitry is then responsive to the asserted erase signal to assert the internal clock signal at a predetermined value independent of the clock signal, the further stage decoding circuitry being responsive to the internal clock signal asserted at that predetermined value to generate the asserted word line signal in dependence on the values of the intermediate signals. Hence, in this embodiment, the internal clock signal is effectively deactivated in the presence of the asserted erase signal and replaced by the asserted predetermined value in order to trigger assertion of the necessary word line signals as dictated by the values of the intermediate signals.

There are a number of ways in which the intermediate signals generated by the first stage decoding circuitry can be manipulated in the presence of the asserted erase signal. In one embodiment, the first stage decoding circuitry comprises a plurality of intermediate signal generation blocks, each intermediate signal generation block being configured to receive a plurality of bits derived from the address indication and to generate, in dependence on the plurality of bits, an associated intermediate signal forming one of the plurality of intermediate signals. In response to the asserted erase signal, at least a subset of the intermediate signal generation blocks are configured to set their intermediate signal to a predetermined value irrespective of the received plurality of bits.

There are a number of ways in which each intermediate signal generation block within the above-mentioned subset can be configured to set its intermediate signal to a predetermined value. In one embodiment, each intermediate signal generation block is configured, in the absence of the asserted erase signal, to implement a NAND gate function in order to derive the associated intermediate signal from the received plurality of bits. In response to the asserted erase signal, the at least a subset of the intermediate signal generation blocks are configured to override the NAND gate function in order to set their associated intermediate signal to the predetermined value irrespective of the received plurality of bits. As will be understood, if the NAND gate function receives as it inputs a plurality of bit values, then only if all of those bit values are one will the NAND gate function output a logic zero value. In one particular embodiment, in the presence of the asserted erase signal, the signal generation block is modified so that it outputs as the predetermined value a logic zero value irrespective of the received plurality of bits. This means that many more intermediate signal generation blocks can be arranged to output logic zero values than would be the case during a normal write operation, and this in turn allows multiple asserted word line signals to be issued at the same time in response to the asserted erase signal.

There are a number of ways in which an intermediate signal generation block can be configured to override its normal NAND gate function. In one embodiment, each such intermediate signal generation block comprises a first transistor circuit configured to drive an output of that intermediate signal generation block to the predetermined value in the presence of the asserted erase signal. In the above-mentioned example where the predetermined value is a logic zero value, this can simply be achieved by coupling an NMOS transistor between the output and ground, with the NMOS transistor being driven by the asserted erase signal (in this embodiment the asserted erase signal being asserted at a logic one value).

Further, in one embodiment, multiple of the intermediate signal generation blocks that are configured to override their NAND gate function can be configured to share a second transistor circuit configured to decouple those multiple intermediate signal generation blocks from a supply voltage in the presence of the asserted erase signal. This prevents the NAND gate components from fighting against the action of the above-mentioned first transistor circuit. In one embodiment, the second transistor circuit can take the form of a PMOS transistor coupling the NAND gate structure to the power supply, and driven by the erase signal. Accordingly, when the erase signal is asserted at a logic one value, the PMOS transistor is turned off, decoupling the NAND gate structure from the power supply. The above approach provides a particularly low transistor count solution. For example, in one embodiment, for a particular group of intermediate signal generation blocks, a PMOS transistor can be shared by them all, and each block only needs an NMOS transistor adding to it in order to implement the above functionality. By way of example, for a group of eight intermediate signal generation blocks, the above described functionality can be achieved by the addition of nine transistors.

There are a number of ways in which the operation of the write circuitry can be modified in the presence of the asserted erase signal. In one embodiment, each column of memory cells is coupled to an associated pair of bit lines, and the write circuitry is configured to be responsive to the asserted erase signal to control the voltage levels on the associated bit line pair for each memory cell in said predetermined erase region, such that for each bit line pair one bit line is at a logic 1 voltage level and the other bit line is at a logic 0 voltage level. Whilst for every column the voltages on the bit line pairs can be arranged identically, so that the same value is written into every memory cell across each row, there is no requirement for the same value to be written into every memory cell, and the value can be set separately for each column by appropriate manipulation of the bit line voltages if desired.

In an alternative embodiment, the write circuitry may be configured to be responsive to the asserted erase signal to control the voltage levels on the associated bit line pair for each memory cell in said predetermined erase region, such that for each bit line pair both bit lines are pulled to a voltage level different to a precharged voltage level of the bit lines, in order to cause random data to be written into the memory cells in the predetermined erase region. Hence, purely by way of example, if the precharge voltage level is a logic one level, then both bit lines may be pulled to the logic zero level during the forced write operation. This will effectively randomise the data written into the memory cells within the predetermined erase region, but still is an effective approach for ensuring that the previous contents of those memory cells are no longer available.

The conditions that cause the erase signal to be asserted will vary dependent on embodiment. Erase activation circuitry can be provided that is responsive to detection of a predetermined event to assert the erase signal to trigger the forced write operation in respect of each memory cell within the predetermined erase region of the array. When considering application of the invention for security reasons, the erase activation circuitry may monitor certain activities to detect activities that are indicative of a potential attack, those activities being considered to give rise to the predetermined event and causing the erase activation circuitry to assert the erase signal. Alternatively, the erase activation circuitry may monitor for detection of a situation where it is apparent that certain secure data stored in the memory device is no longer required, and can use that as a trigger to assert the erase signal. As mentioned earlier, the invention is not restricted to secure applications, and may be used in any situation where there is a requirement to erase a certain portion of the memory device in an efficient manner, such as the earlier mentioned example where it may be required to invalidate all of the entries in a cache.

The erase activation circuitry may be provided externally to the memory device, or in one embodiment may be provided within the memory device itself.

The above described techniques can be applied in a wide range of memory devices, for example SRAM memory, dual port memory, flash memory, DRAM memory, a register file (typically formed from 8T SRAM cells), etc.

If the predetermined erase region is large, and in particular if it occupies a significant number of rows within the memory array, then the above-described modified behaviour of the decoder circuitry can result in potentially a large number of word lines being asserted at the same time. This can give rise to a large, and easily detectable, in-rush current as the multiple word line drivers within the decoder circuitry activate their corresponding word lines. Such a large draw of current could also potentially affect neighbouring logic around the memory device within a system-on-chip containing the memory device, if it is not well controlled.

In accordance with one embodiment, the operation of the decoder circuitry is further modified in order to limit the in-rush current. In particular, the decoder circuitry is configured to be responsive to the asserted erase signal to treat the word lines associated with the multiple rows within the predetermined erase region as forming a plurality of word line groups, and to stagger in time issuance of the asserted word line signal to the word lines in different word line groups in the plurality of word line groups. By staggering the time at which the word line signals are asserted, this reduces the in-rush current drawn by the word line drivers. As less drivers are activated at the same time, this also allows the word lines to be activated more quickly, which in turn causes the writing of the addressed memory cells to occur more quickly, causing less crowbar current to be consumed within the memory cells. This in turn allows the size of the components within the write circuitry used to control the voltages on the bit lines to be reduced.

Because the word lines are actually activated more quickly when using the above staggered approach, it has been found that the same result can be achieved, in the same period of time, as would be the case if all of the word line drivers were activated at the same time, but the staggered approach results in a much smoother power consumption behaviour.

There are a number of ways in which the decoder circuitry can be configured to stagger in time the issuance of the asserted word line signals. As mentioned earlier, in one embodiment the decoder circuitry comprises first stage decoding circuitry configured to generate a plurality of intermediate signals in response to the address indication, and further stage decoding circuitry configured to generate the asserted word line signal in dependence on values of the intermediate signals, and the decoder circuitry is configured to be responsive to the asserted erase signal to set the intermediate signals to values which will cause the further stage decoding circuitry to then issue the asserted word line signal on the word line associated with each row in said predetermined erase region. In such an embodiment, the decoder circuitry may be configured to be responsive to the asserted erase signal to stagger in time the setting of the intermediate signals to said values, in order to cause to be staggered in time the issuance of the asserted word line signal to the word lines in different word line groups in the plurality of word line groups. Hence, in such an embodiment, by staggering in time the setting of the intermediate signals, this ensures that the word line signals are asserted in a staggered manner.

In one particular embodiment where the first stage decoding circuitry comprises a plurality of intermediate signal generation blocks, and at least a subset of those intermediate signal generation blocks are configured, in the presence of the asserted erase signal, to set their intermediate signal to a predetermined value irrespective of the received plurality of bits, the staggering of the generation of the intermediate signals can be achieved by providing delay circuitry within the decoder circuitry to differentially delay propagation of the asserted erase signal to the intermediate generation blocks in said at least a subset.

The delay circuitry can be arranged in a variety of ways. For example, if the intermediate signal generation blocks are considered to form multiple intermediate signal generation groups, the delay circuitry may be configured to differentially delay propagation of the asserted erase signal to the intermediate generation blocks in at least one of those groups. In one particular embodiment, the delay circuitry may be configured to delay propagation of the asserted erase signal to one of the groups, whilst no such delay circuitry is included in the other groups. This allows sets of word lines to be activated at a time, whilst avoiding a situation where all of the required word lines are activated at the same time.

In one particular embodiment, the delay circuitry is configured to delay propagation of the asserted erase signal to every intermediate signal generation block in said at least one of said multiple intermediate signal generation groups. In particular, due to the manner in which the decoder circuitry operates during a normal operation, one intermediate signal generation block in each intermediate signal generation group will be preconditioned to generate the output value that will need to be generated by multiple of those intermediate signal generation blocks in the presence of the asserted erase signal. Hence, with regard to any intermediate signal generation group that is going to be subjected to the above-described delay mechanism, there is no need initially to provide the erase signal to any of the intermediate signal generation blocks in that group, since there will be one arbitrary intermediate signal generation block in that group that is already producing the required output. Hence, by delaying propagation of the asserted erase signal to all of the intermediate signal generation blocks in the relevant intermediate signal generation group, this further smooths the power consumption, and in particular ensures a predictable initial in-rush current when the erase signal is first asserted.

The sizing of the components in the write driver circuitry needs to be such that when the write driver circuitry is controlling the voltages on the bit lines during the erase procedure, it can overcome any counteracting effect produced by the bit cells connected to the relevant column. In the worst case scenario, the write driver circuitry may be seeking to write a first data value into every bit cell in the column, in a situation where every bit cell in the column currently stores a second, opposite, value. In that situation, the write driver circuitry components will need to be strong enough to overcome the counteractive effects that the bit cells will present on the bit lines. In one embodiment, the above-described staggering mechanism can be adapted to assist the writing process, and hence reduce the size of the components required within the write circuitry. In particular, in one embodiment, the decoder circuitry is configured to issue the asserted word line signal to the word lines in a first word line group and to defer issuance of the asserted word line signal to any further word line groups until the forced write operation has been completed in respect of the memory cells of the predetermined erase region that are associated with the first word line group.

By ensuring that when the asserted word line signals are issued to every row in the first word line group, a delay is then introduced sufficient to ensure that the forced write operation is completed in respect of the memory cells associated with that first word line group, this ensures that when the word line signals are asserted for subsequent word line groups, all of the memory cells that have been erased in respect of the first word line group will actually assist the write circuitry in flipping state of the bit cells associated with the remaining word line groups. This hence enables a reduction in the size of the components provided within the write circuitry, whilst still enabling the erase process to be performed efficiently. Further, the reduced size of the components in the write circuitry also ensures that the presence of those components does not adversely impact the operation of the memory device when performing normal read and write operations.

Viewed from a second aspect, the present invention provides a method of operating a memory device comprising an array of memory cells arranged as a plurality of rows and columns, each row of memory cells being coupled to an associated word line, and each column of memory cells being coupled to an associated at least one bit line, the method comprising: decoding, in response to a write operation, an address indication associated with the write operation in order to determine the row containing addressed memory cells for the write operation, and issuing, in dependence on a clock signal, an asserted word line signal on the associated word line for the determined row; and controlling, in response to said write operation, a voltage level of the associated at least one bit line for each of said addressed memory cells to cause write data to be written into said addressed memory cells; modifying the decoding step in response to an asserted erase signal to issue, independently of said clock signal, said asserted word line signal on the word line associated with each row in a predetermined erase region of the array; and modifying said controlling step in response to said asserted erase signal to control the voltage level of the associated at least one bit line for each memory cell in said predetermined erase region, in order to cause erase write data to be written into the memory cells of said predetermined erase region; whereby the memory device is responsive to said asserted erase signal to trigger a forced write operation in respect of each memory cell within said predetermined erase region.

Viewed from a third aspect, the present invention provides a memory device comprising: an array of memory cell means arranged as a plurality of rows and columns, each row of memory cell means being coupled to an associated word line, and each column of memory cell means being coupled to an associated at least one bit line; decoder means for decoding, in response to a write operation, an address indication associated with the write operation in order to determine the row containing addressed memory cell means for the write operation, and for issuing, in dependence on a clock signal, an asserted word line signal on the associated word line for the determined row; and write means for controlling, in response to said write operation, a voltage level of the associated at least one bit line for each of said addressed memory cell means to cause write data to be written into said addressed memory cell means; the decoder means for issuing, in response to an asserted erase signal, and independently of said clock signal, said asserted word line signal on the word line associated with each row in a predetermined erase region of the array; and the write means for controlling, in response to said asserted erase signal, the voltage level of the associated at least one bit line for each memory cell means in said predetermined erase region, in order to cause erase write data to be written into the memory cell means of said predetermined erase region; whereby the memory device is responsive to said asserted erase signal to trigger a forced write operation in respect of each memory cell means within said predetermined erase region.

Viewed from a fourth aspect, the present invention provides a computer program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device in accordance with the first aspect of the present invention.

BRIEF DESCRIPTION OF THE DRAWINGS

The present invention will be described further, by way of example only, with reference to embodiments as illustrated in the accompanying drawings, in which:

FIG. 8 illustrates the timing of assertion of the word line signals in accordance with one specific embodiment of the delay mechanism, when compared with the non-delayed approach;

DESCRIPTION OF EMBODIMENTS

Figure 1:
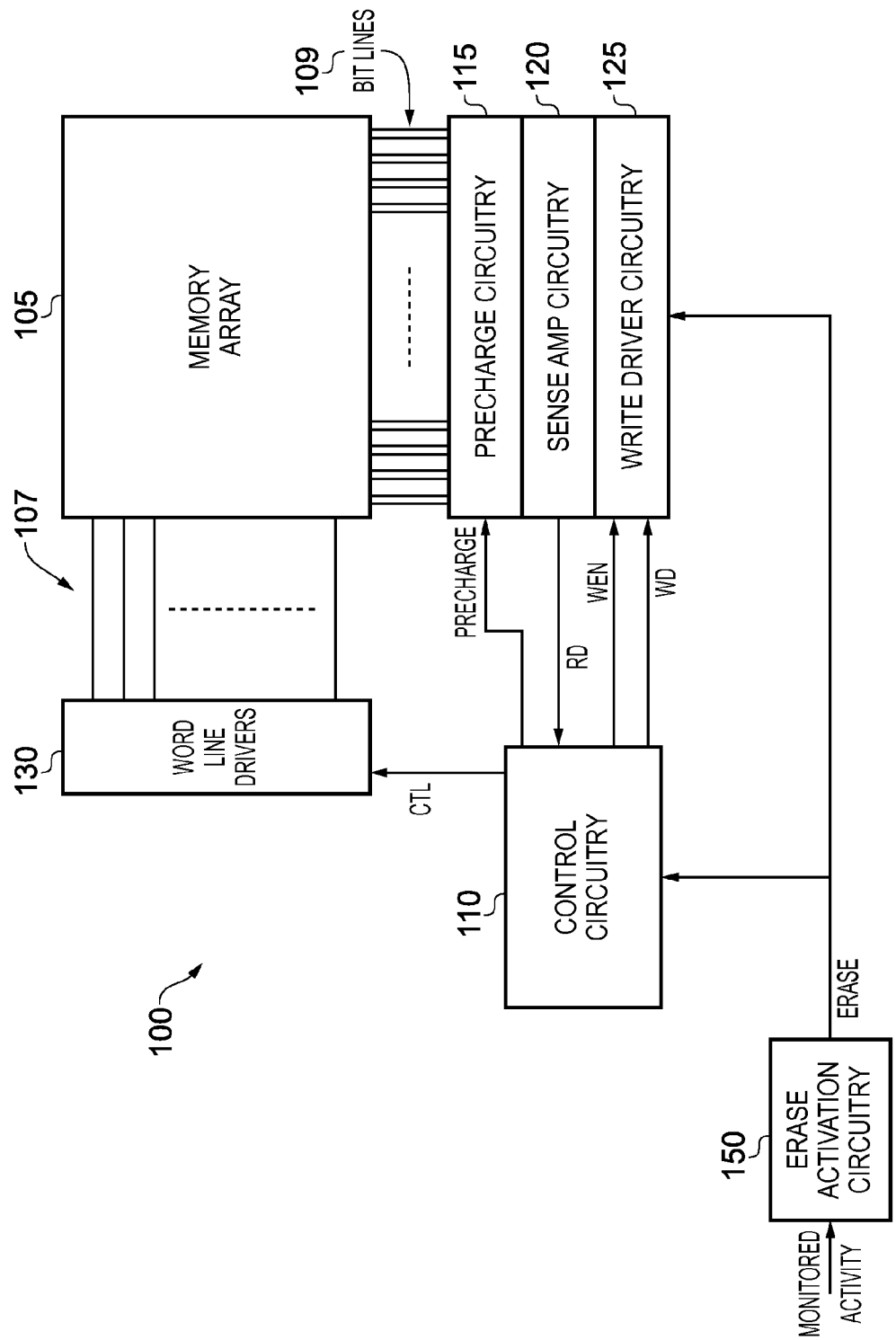
FIG. 1 is a block diagram schematically illustrating a memory device in accordance with one embodiment.

FIG. 1 is a diagram schematically illustrating a logical arrangement of a memory device in accordance with one embodiment. In particular, the memory device 100 includes a memory array 105 comprising an array of memory cells arranged in a plurality of rows and columns A plurality of word lines 107 are provided through the array in order to allow individual rows of memory cells to be addressed by the word line drivers 130 during write and read operations. In addition, a plurality of bit lines 109 are provided in association with the columns of memory cells. In one embodiment, each column is coupled to a pair of bit lines to enable data to be written into an activated memory cell of the column during a write operation, and for data to be read from an activated memory cell of the column during a read operation.

Precharge circuitry 115 is used to precharge the voltage level on the bit lines under the control of control circuitry 110. Following the precharge operation, a write operation or read operation can be performed. For a write operation, the control circuitry 110 will issue control signals to the word line drivers 130 in order to cause a particular row of memory cells to be activated via the associated word line, and the control circuitry 110 will further cause the write driver circuitry 125 to control the voltages on the relevant bit line pairs, in order to cause the required data values to be written into the memory cells of the activated row. For a read operation, again the control circuitry 110 will issue control signals to the word line drivers 130 in order to cause a particular row of memory cells to be activated via the appropriate word line, and the sense amplifier circuitry 120 will then be used in order to evaluate the voltages on the relevant bit lines, with the sensed read data then being returned to the control circuitry 110.

As will be discussed in more detail with reference to the remaining figures, in accordance with the described embodiments the control circuitry 110 and write driver circuitry 125 are modified so that in response to an asserted erase signal the control circuitry performs a modified decode operation which causes the word line driver circuitry 130 to assert a word line signal on the word line associated with each row in a predetermined erase region. The asserted erase signal also causes the write driver circuitry to control the voltage level on the bit lines for each memory cell in the predetermined erase region in order to cause erase write data to be written in to the memory cells of the predetermined erase region. Further, as will be discussed, this modified operation occurs independently of the clock signal, and hence will occur even if the clock signal is removed from the memory device.

As shown in FIG. 1, erase activation circuitry 150 is configured to monitor certain activity within the system incorporating the memory device in order to detect occurrence of a predetermined condition, and on occurrence of that predetermined condition is arranged to assert the erase signal to both the control circuitry 110 and the write driver circuitry 125. The activity that is monitored will depend on the implementation. For example, in a security implementation, the erase activation circuitry 150 may monitor for activity indicative that a processing device has finished utilising secure data stored in the memory array, and when that condition is observed it may then assert the erase signal to cause that sensitive data to be erased from the memory device. Alternatively, the erase activation circuitry may monitor for activities indicative of an attempted hacking operation, and in that instance assert the erase signal. In non-security based applications, other activity may be monitored, for example an activity that indicates that multiple rows in the memory array need clearing, with the erase signal then being asserted to provide an efficient mechanism for erasing the data in the predetermined erase region without the need for the processing device to issue a series of separate write operations to overwrite the data in each row of the predetermined erase region.

The techniques of the described embodiments can be used in a wide variety of memory devices, for example an SRAM memory, a dual port memory, a flash memory, a DRAM memory, a register file, etc.

The erase activation circuitry 150 may be provided externally to the memory device, or in one embodiment can be provided internally within the memory device.

Whilst FIG. 1 is intended to logically illustrate the arrangement of the memory device, it will be appreciated that it is not intended to provide an indication of the structural arrangement. For example, the sense amplifier circuitry 120 may actually be embedded within blocks forming the memory array, as may the precharge circuitry 115.

Figure 2:
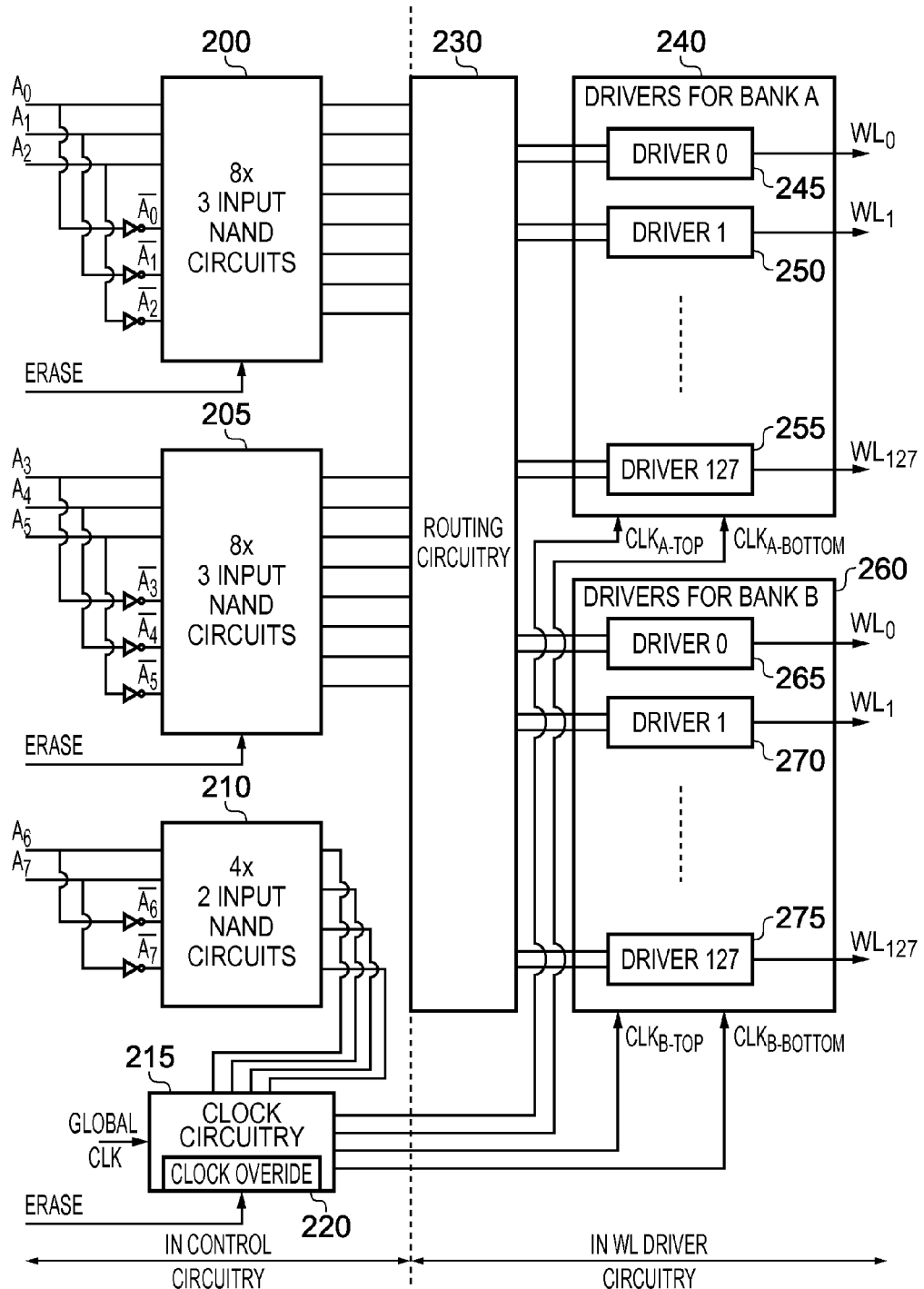
FIG. 2 is a block diagram illustrating in more detail the construction of the control circuitry and word line driver circuitry of FIG. 1 in accordance with one embodiment.

FIG. 2 is a block diagram illustrating in more detail components provided within the control circuitry 110 and the word line driver circuitry 130 of FIG. 1 to perform a decoding operation in accordance with one embodiment. As can be seen from FIG. 2, the decoding operation is split into two separate stages. In particular, a first stage decoding operation (also commonly referred to as a pre-decode operation) is performed within the control circuitry using the pre-decode circuits 200, 205, 210, 215. Thereafter, a further decode stage is performed within the word line drivers of the word line driver circuitry 130, in the embodiment shown these word line drivers 245, 250, 255, 265, 270, 275 being logically grouped into a first group 240 associated with a first bank within the memory array and a second group 260 associated with a second bank in the memory array. For the purposes of the present invention, it does not matter whether the memory array is partitioned into separate banks, and if it is partitioned, it does not matter how many banks it is partitioned into.

Each of the pre-decode circuits 200, 205, 210, comprises a plurality of intermediate signal generation blocks. In particular, the circuit 200 is arranged to receive three bits of a received address, along with the inverse values of those address bits, and includes eight intermediate signal generation blocks each configured to receive a predetermined three of the received six values and to generate a corresponding intermediate signal for passing to the routing circuitry 230 (in this embodiment the routing circuitry being considered to be provided within the word line driver circuitry 130). Each intermediate signal generation block effectively implements a NAND function, but as will be discussed in more detail later with reference to the remaining figures at least some of those NAND circuits are modified slightly to enable the NAND function to be overridden in the presence of an asserted erase signal.

The pre-decode circuit 205 is arranged in the same way as the circuit 200, the circuit 205 receiving a further three address bits and the inverted versions of those address bits, and generating a further eight intermediate signals for routing to the routing circuitry 230. Again, one or more of the NAND circuits within the pre-decode circuitry 205 may be modified in order to override the NAND functionality in the presence of an asserted erase signal.

As shown in FIG. 2, the pre-decode circuitry 210 consists of four two input NAND circuits, and the pre-decode circuitry 210 receives a further two address bits and the inverted versions of those address bits. The outputs from the pre-decode circuit 210 are not provided directly to the routing circuitry, but instead are provided as a sequence of bank select signals to the clock circuitry 215. In particular, in this embodiment it is assumed that each of the two banks A and B are actually addressable in two halves, referred to as top and bottom halves, and accordingly the four outputs from the pre-decode circuitry 210 are used to identify which of those four possible regions is to be addressed. During a normal operation, if the relevant output from the pre-decode circuit 210 is asserted at a logic one value, then on the rising edge of the global clock signal, an asserted clock signal will be issued to the corresponding group of word line drivers associated with the top or bottom section of bank A or bank B being addressed. However, as will be discussed in more detail later with reference to the remaining figures, the clock circuitry is provided with a clock override function 220 which, on receipt of an asserted erase signal, will override such functionality in respect of at least one of the four sections, and will instead issue an asserted signal over the relevant clock path irrespective of the input received from the pre-decode circuit 210, and irrespective of the state of the global clock signal.

Figure 3:
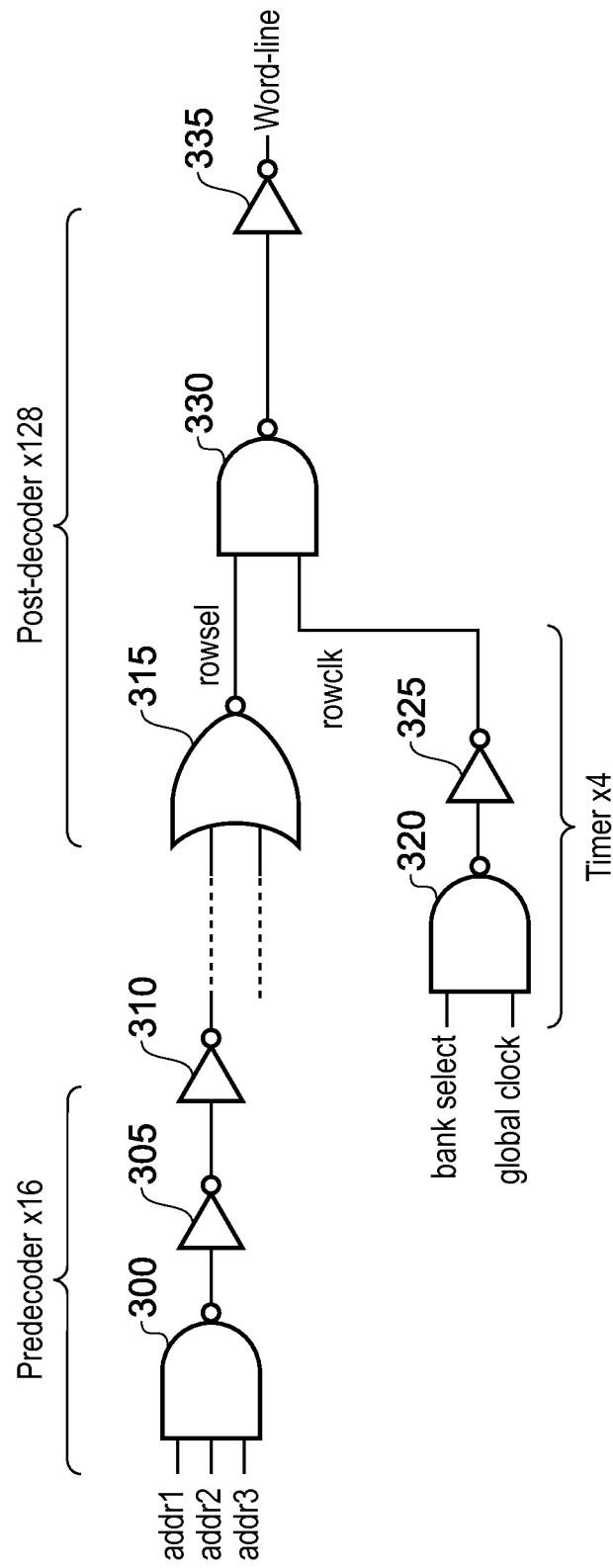
FIG. 3 illustrates a known approach for splitting the decoding operation into a pre-decode stage performed by the control circuitry and a post-decode stage performed within the word line driver circuitry.

FIG. 3 schematically illustrates components that may be provided within the circuitry of FIG. 2 in accordance with a conventional approach, where the circuitry is not modified to accommodate the asserted erase signal and associated functionality. In particular, within each of the pre-decode circuits 200, 205, each intermediate signal generation block may comprise a NAND circuit 300 and two inverter circuits 305, 310. As will be understood, only when the associated three address bits provided as an input to that NAND gate circuit are at a logic one value, will the NAND gate issue a logic zero value, and accordingly only in that particular situation will a logic zero value ultimately be output from the inverter 310. During a normal operation, only one intermediate signal generation block within the pre-decoder circuit 200 and one intermediate signal generation block within the pre-decoder circuit 205 will receive three logic one inputs, and accordingly only those two intermediate signal generation blocks will output a logic zero value.

The routing circuitry 230 routes different pairs of the intermediate signals to each of the various word line driver circuits 245, 250, 255, 265, 270, 275. Due to the two sets of eight intermediate signals generated by the pre-decode circuits 200, 205, this gives rise to 64 possible combinations, and hence typically four of the 256 word line drivers will receive a pair of inputs that are both at a logic zero value.

However, the pre-decode circuitry 210 will also be arranged such that only one of its outputs will be at a logic zero value, and accordingly via the clock circuitry, only one of the four clock signal paths will be asserted. Accordingly, only one of the word line driver circuits will receive both two logic zero inputs from the routing circuitry, and an asserted clock signal, and accordingly during normal operation only one of the word line signals will be asserted.

The operation of the clock circuitry 215 is shown in FIG. 3 by the components 320, 325. In particular, the clock circuitry will replicate the components 320, 325 for each of the four inputs from the pre-decode circuitry 210. As discussed earlier, only one of the output signals from circuitry 210 will be at a logic zero value. Bank select signals are determined from the inverse of those output signals and hence only one bank select signal will be at a logic one value. Accordingly, on a rising edge of the global clock signal, the relevant NAND gate 320 will receive two logic one input values and will hence output a logic zero value, thus causing the inverter 325 to output a logic one value to the NAND gate 330.

Each of the word line driver circuits 245, 250, 255, 265, 270, 275 includes the components 315, 330, 335. However, as mentioned earlier, four word line driver circuits will receive the same combination of two intermediate signals from the routing circuitry, and accordingly the NOR gate 315 can be shared between those four drivers. As will be appreciated, only when the two input signals to the NOR gate 315 are both at a logic zero value will a logic one value be output as the row select signal from that NOR gate. Given the earlier described functionality of the clock circuitry, it will be appreciated that only a single one of the word line drivers 245 will hence receive at its NAND gate 330 two logic one input values, and accordingly only that word line driver will then output from its NAND gate 330 a logic zero value, which will in turn cause an asserted word line signal to be issued from the inverter 335 at a logic one value.

Figure 4:
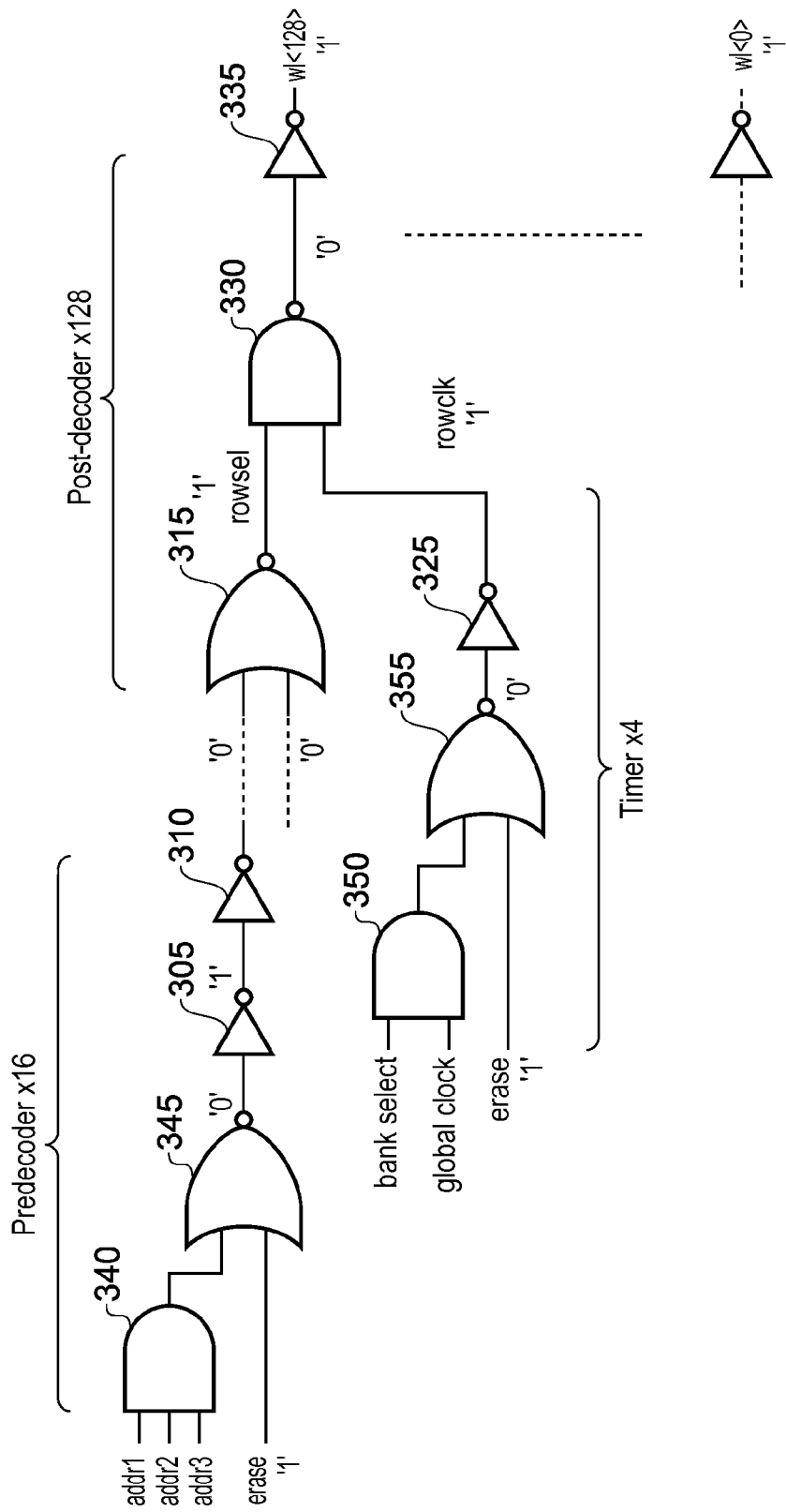
FIG. 4 illustrates how the circuitry of FIG. 3 can be adapted in accordance with one embodiment to enable a forced write operation to be performed within a predetermined erase region of the memory device.

In accordance with the described embodiments incorporating the erase functionality, at least some of the intermediate signal generation blocks within the pre-decode circuits 200 and 205 are modified as shown in FIG. 4. In particular, the standard NAND gate 300 is replaced with an AND gate 340 and a NOR gate 345. During normal operation where the erase signal is unasserted, it will be appreciated that this hence implements exactly the same function as the NAND gate circuit 300. However, when the erase signal is asserted this causes the output of the NOR gate 345 to change to a logic zero value irrespective of the three address inputs to AND gate 340, which in turn causes a logic zero value to be output from the inverter 310. Where multiple of the intermediate signal generation blocks are modified in this manner, this causes multiple of the intermediate signals to be issued at a logic zero value, and this in turn means that multiple of the NOR gates 315 within the word line driver circuits can be arranged to receive two logic zero values. This hence enables multiple word lines to be activated at the same time.

Similar circuitry will also be incorporated within at least one of the clock circuits within the clock circuitry 215. Accordingly, the NAND gate function 320 of FIG. 3 is replaced by an AND gate 350 and NOR gate 355. When the erase signal is unasserted, this hence does not affect the operation of the clock circuitry, but when the erase signal is asserted, this effectively overrides the global clock signal, and causes a logic zero value to be output from the NOR gate 355, which in turn causes a logic one value to be output from the inverter 325. For the corresponding section of the memory array (i.e. the top part or the bottom part of bank A or the top part or the bottom part of bank B) this will mean that all of the word line drivers will be primed to assert their word line signal in the event that their associated NOR gate 315 receives two logic zero values.

It will hence be seen that this approach enables multiple word lines to be asserted at the same time, and in a clock independent manner. This hence provides a very efficient mechanism for overwriting data within a predetermined erase region of the memory array. The exact configuration of the predetermined erase region can be determined by deciding which of the various intermediate signal generation blocks within the pre-decoders 200, 205 and which of the clock circuits within the clock circuitry 215 to modify in accordance with the circuitry of FIG. 4. For example, if all 16 intermediate signal generation blocks within the pre-decoders 200, 205 are modified as shown in FIG. 4, and all of the four clock circuits within the clock circuitry 215 are also modified as shown in FIG. 4, it will be seen that this will cause all of the word lines in both banks to be asserted in the presence of an asserted erase signal, hence causing the entire memory array to be erased. However, there is no need to erase the entire memory array, and by limiting the clock modification circuitry to a subset of the four clock circuits within the clock circuitry 215, the erase operation can be restricted to a particular bank and indeed to a particular top or bottom half of the bank. Further, not all of the rows of memory cells within that selected portion of the memory array need to be erased, and instead this can be configured dependent on which of the 16 intermediate signal generation blocks within the pre-decode circuits 200, 205 are modified in the manner shown in FIG. 4.

Figure 5:
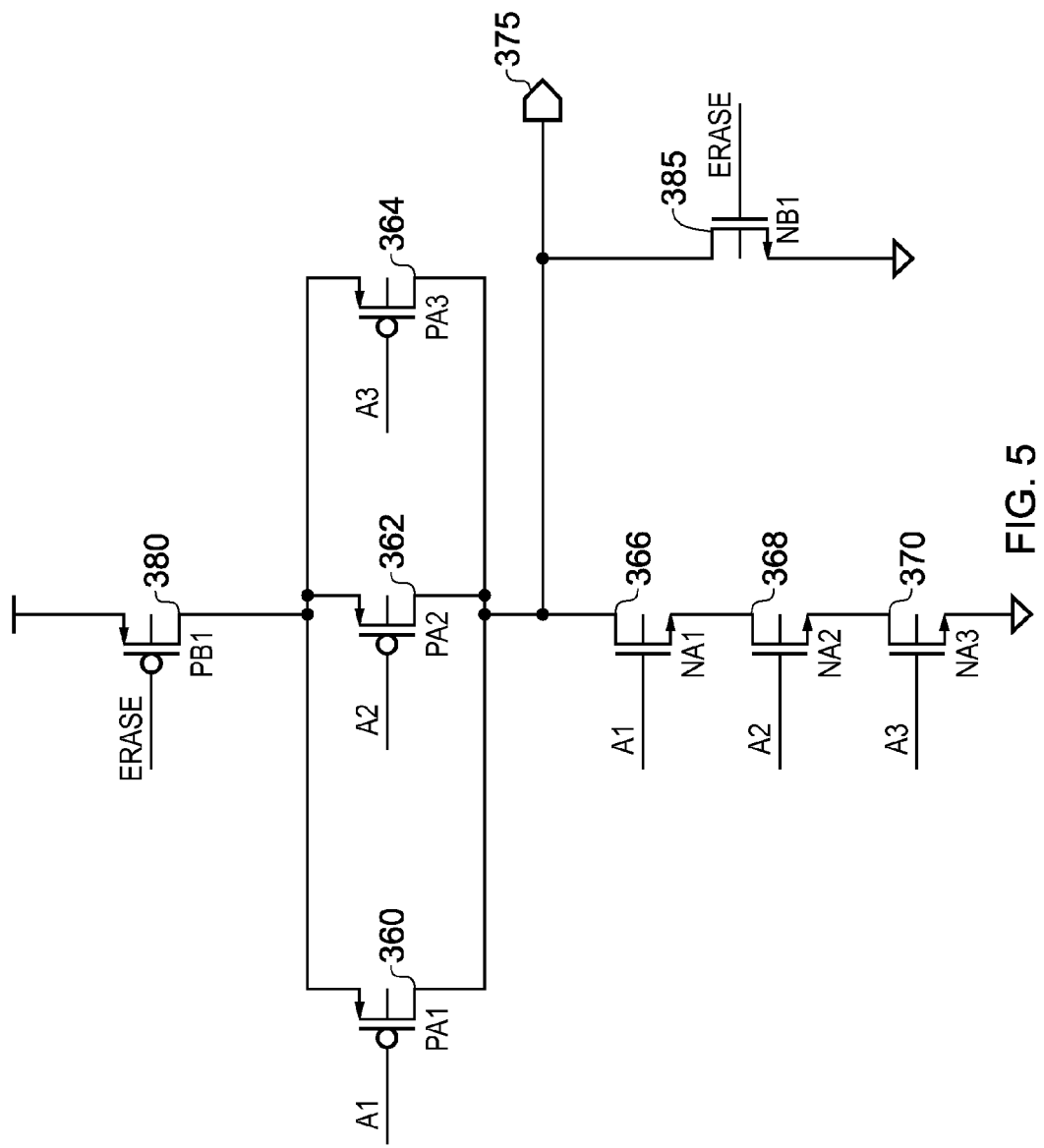
FIG. 5 illustrates how the NAND gate structure within the pre-decoder of FIG. 3 may be modified in order to implement the modified function of FIG. 4 in accordance with one embodiment.

FIG. 5 shows an efficient mechanism for modifying a NAND gate structure to produce the structure 340, 345 or 350, 355 of FIG. 4. In particular, the basic NAND circuit comprises three PMOS transistors 360, 362, 364 in parallel, coupled to three NMOS transistors 366, 368, 370 in series. Each PMOS transistor receives a corresponding one of the three address inputs, as do each of the three NMOS transistors. To modify the NAND gate structure, an NMOS transistor 385 is coupled between the output node 375 over which the intermediate signal is output, and a ground potential, with that NMOS transistor being driven by the erase signal. In addition, a PMOS transistor 380 is coupled between the power supply and the parallel configuration of PMOS transistors 360, 362, 364, this PMOS transistor also being driven by the erase signal. In the absence of an asserted erase signal, it will be seen that the PMOS transistor 380 is turned on and the NMOS transistor 385 is turned off, and accordingly the circuitry operates as a standard NAND gate. However, when the erase signal is asserted, the PMOS transistor 380 turns off, decoupling the NAND gate structure from the power supply. In addition, the NMOS transistor 385 turns on, discharging the output node 375 to ground (i.e. a logic zero value).

Whilst in one embodiment a separate NMOS transistor 385 will be provided in association with each of the intermediate signal generation blocks, in one embodiment the PMOS transistor 380 is shared amongst all of the intermediate signal generation blocks within a particular pre-decode circuit 200, 205 whose function is to be modified by the erase signal. Hence, if all eight of the intermediate signal generation blocks within a particular pre-decode circuit 200, 205 are to be modified, then it will be seen that a total of nine additional transistors (eight NMOS transistors and one PMOS transistor) needs to be added to the pre-decode circuitry. This provides a particularly small increase in gate count, which makes the presence of this modification circuitry very difficult to detect, hence further improving security.

Figure 6:
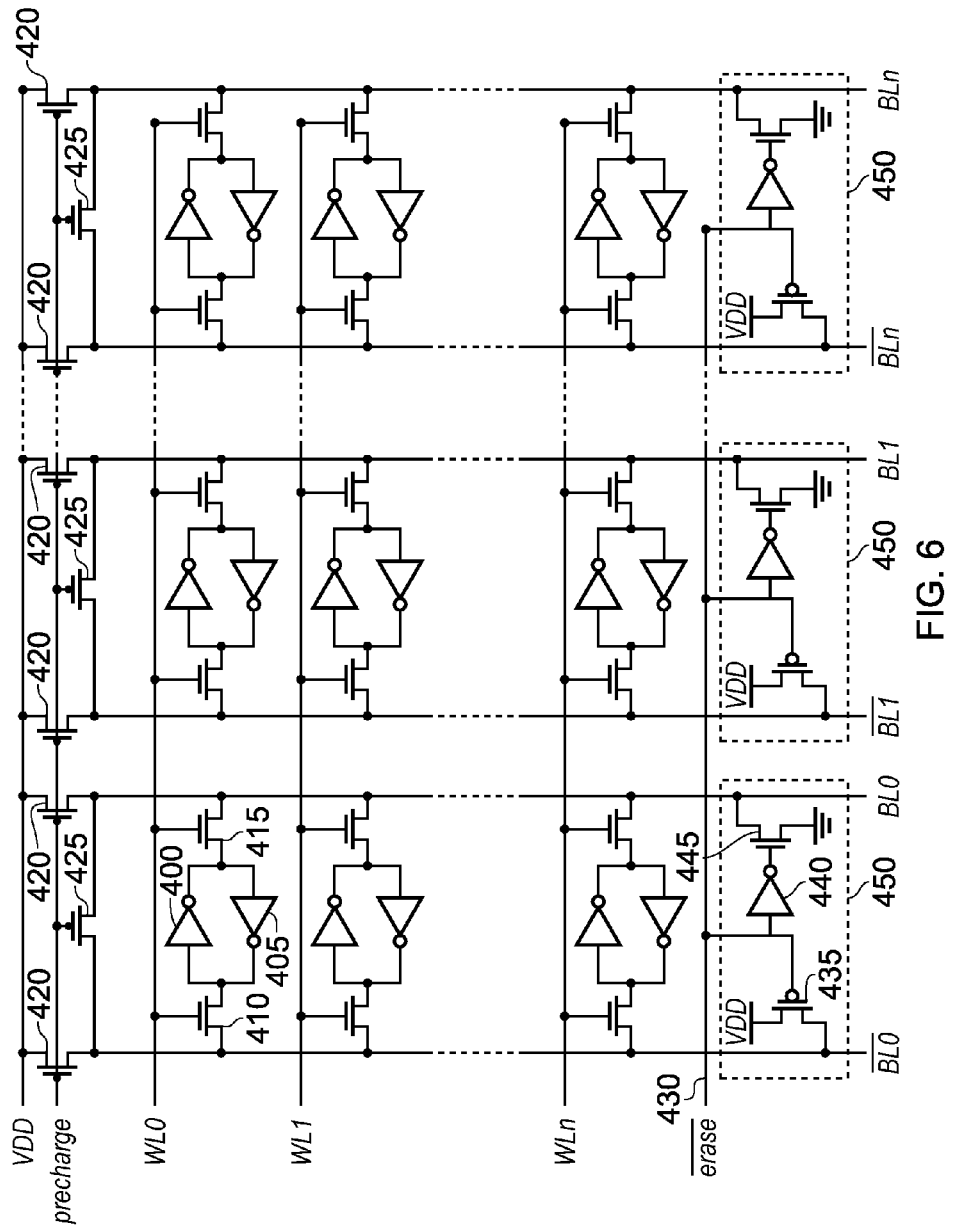
FIG. 6 illustrates components that can be provided within the write driver circuitry of FIG. 1 in accordance with one embodiment to control the voltage on the bit lines in the presence of an asserted erase signal, in accordance with one embodiment.

FIG. 6 illustrates how the write driver circuitry 125 may be modified to control the voltages on the bit lines in the presence of an asserted erase signal. In this example, it is assumed that the memory array 105 comprises an array of 6T SRAM memory cells, each 6T SRAM memory cell comprising a pair of inverters 400, 405, and two NMOS transistors 410, 415. During a normal write operation, one of the word line signals would be asserted, turning on the NMOS transistors 410, 415 for each memory cell in the row associated with that asserted word line signal. This hence couples the pair of inverters 400, 405 to the bit lines, and enables the data value to be written into each of the addressed memory cells dependent on the value present on each of the bit lines. As shown, precharge circuitry 420 is used to precharge each of the bit lines to a logic one voltage level prior to a write operation. The PMOS transistors 425 are also considered to form part of the precharge circuitry, and ensure that both bit lines are coupled together during the precharge operation, thereby ensuring that exactly the same voltage is present on the bit lines of each bit line pair at the end of the precharge operation. Following the precharge operation, the precharge signal is de-asserted to a logic one level, hence turning the precharge transistors 420, 425 off. At this point, the write driver circuitry 125 will pull the voltage on one bit line of each bit line pair to a logic zero value, in order to cause the required data value to be written into the addressed memory cells.

As shown in FIG. 6, in one embodiment the write driver circuitry also includes some additional components to control the voltages on each bit line pair in response to an asserted erase signal. In particular, when the erase signal is asserted at a logic one value, the inverted erase signal provided over path 430 will be at a logic zero value. This will cause the PMOS transistor 435 in each circuit block 450 to turn on, thereby retaining the left hand side bit line at the logic one value. Similarly, via the inverter 440, this will cause the NMOS transistor 445 to turn on, hence pulling the voltage on the right hand side bit line of each bit line pair down to a logic zero value. This will hence cause the same value (for example a logic zero value) to be written into each memory cell connected to an asserted word line. As discussed earlier, when the erase signal is asserted, multiple word lines can be activated at the same time, and accordingly this can cause the same value to be written into a large number of memory cells in a very short period of time.

FIG. 6 is merely provided as one example of how the write driver circuitry can be modified to respond to the asserted erase signal. However, there is no requirement that every block 450 is configured in the same way, nor indeed is there any requirement that the two bit lines in each bit line pair are pulled in opposite directions. For example, in one embodiment the blocks 450 can be configured to pull both bit lines in each bit line pair to the logic zero value, which will effectively mean that random data is stored in each of the memory cells connected to an asserted word line. However, this is still sufficient to ensure that whatever data was previously stored in those memory cells has now been overwritten and can no longer be accessed, hence preventing a hacker from taking advantage of the earlier described remanence effects. In another embodiment, the write driver circuitry 125 can merely be arranged to store into each row receiving an asserted word line signal the data values currently present on its input pins.

Whilst the above described embodiments provide a very efficient and effective mechanism for overwriting multiple rows of the memory array within the predetermined erase region, they can give rise to a significant in rush current being drawn by the word line driver circuits. In particular, the final inverter circuits 335 provided in each word line driver circuit are typically quite large, and if a large number of those are turned on simultaneously, this will give rise to a large, and easily detectable, in rush current being drawn by the word line driver circuitry 130. When a larger number of the word lines are asserted at the same time, the transition of each word line from the unasserted to the asserted state will occur more slowly than would be the case when a single word line is asserted. This means that it will take longer for the addressed memory cells to be written to, and this can increase the crowbar current, and in turn require the sizing of the write driver components within the blocks 450 to be increased.

Figure 7A:
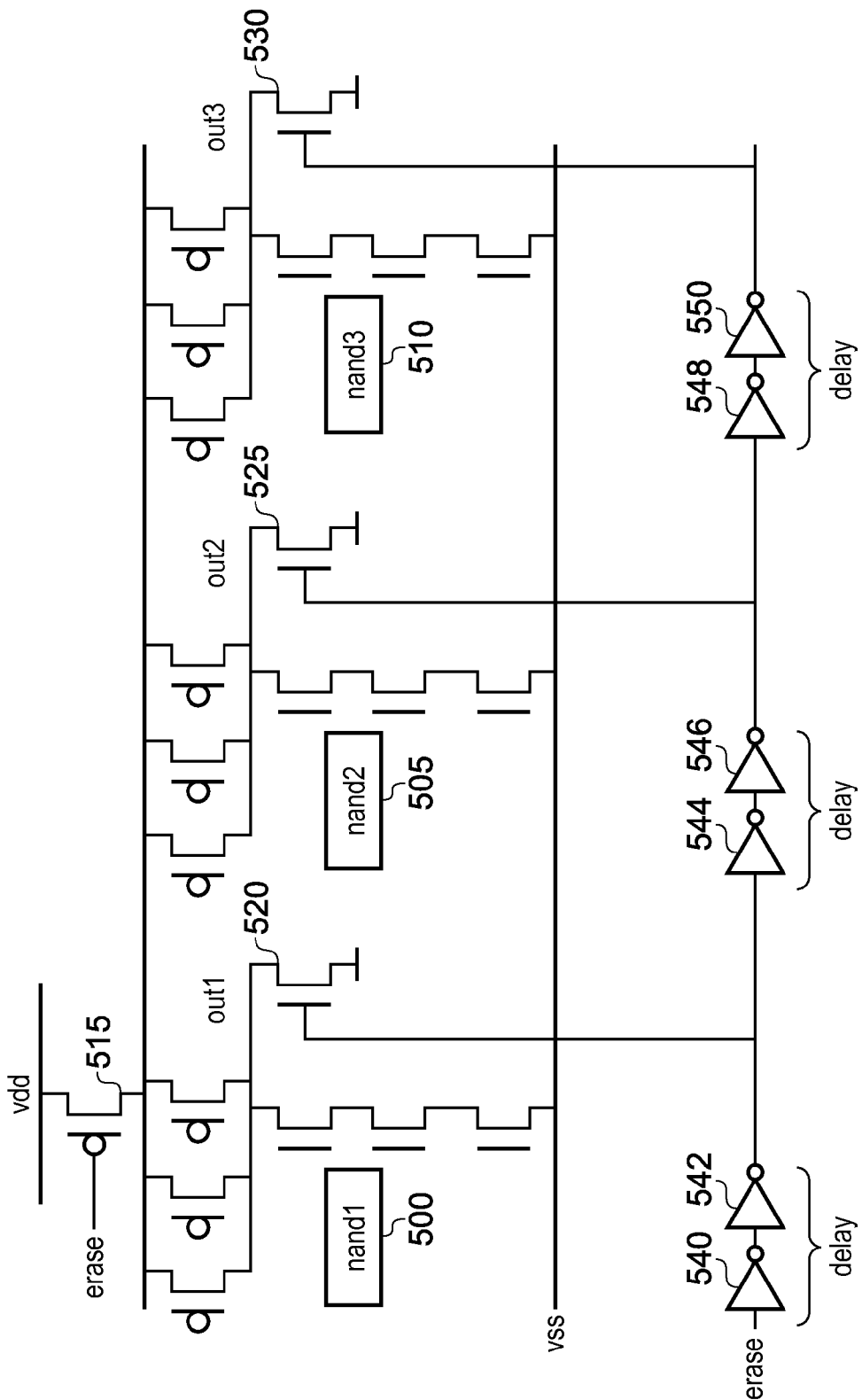
FIG. 7A illustrates how a delay may be introduced in the propagation of the asserted erase signal to a sequence of modified NAND gate structures, in accordance with one embodiment.

FIG. 7A illustrates a staggered delay mechanism that can be used to alleviate these issues. In particular, within at least some of the intermediate signal generation blocks modified as shown in FIG. 4, the timing of the propagation of the asserted erase signal to the NOR gates 345 is staggered, such that the timing of the transition of the intermediate signals to a logic zero value is staggered. This in turn will stagger the timing at which the word lines are asserted, thereby reducing the in rush current. Hence, as shown in FIG. 7A, for those intermediate signal generation blocks within a particular pre-decode circuit 200, 205 that are to be responsive to the erase signal, the timing of the transmission of that erase signal to those intermediate signal generation blocks is staggered. Hence, each of the basic NAND gate circuits 500, 505, 510 is modified as discussed earlier with reference to FIG. 5 by the addition of a separate NMOS transistor 520, 525, 530 for each signal generation block, but with the signal generation blocks sharing the PMOS transistor 515. The erase signal is provided immediately to the PMOS transistor, but is delayed before being provided to the NMOS transistors. Further, due to the delay elements 540, 542, 544, 546, 548, 550, each NMOS transistor 520, 525, 530 receives the erase signal at a different time. Hence, output 1 will transition to the logic zero value before output 2, and output 2 will transition to the logic zero value before output 3.

Figure 7B:
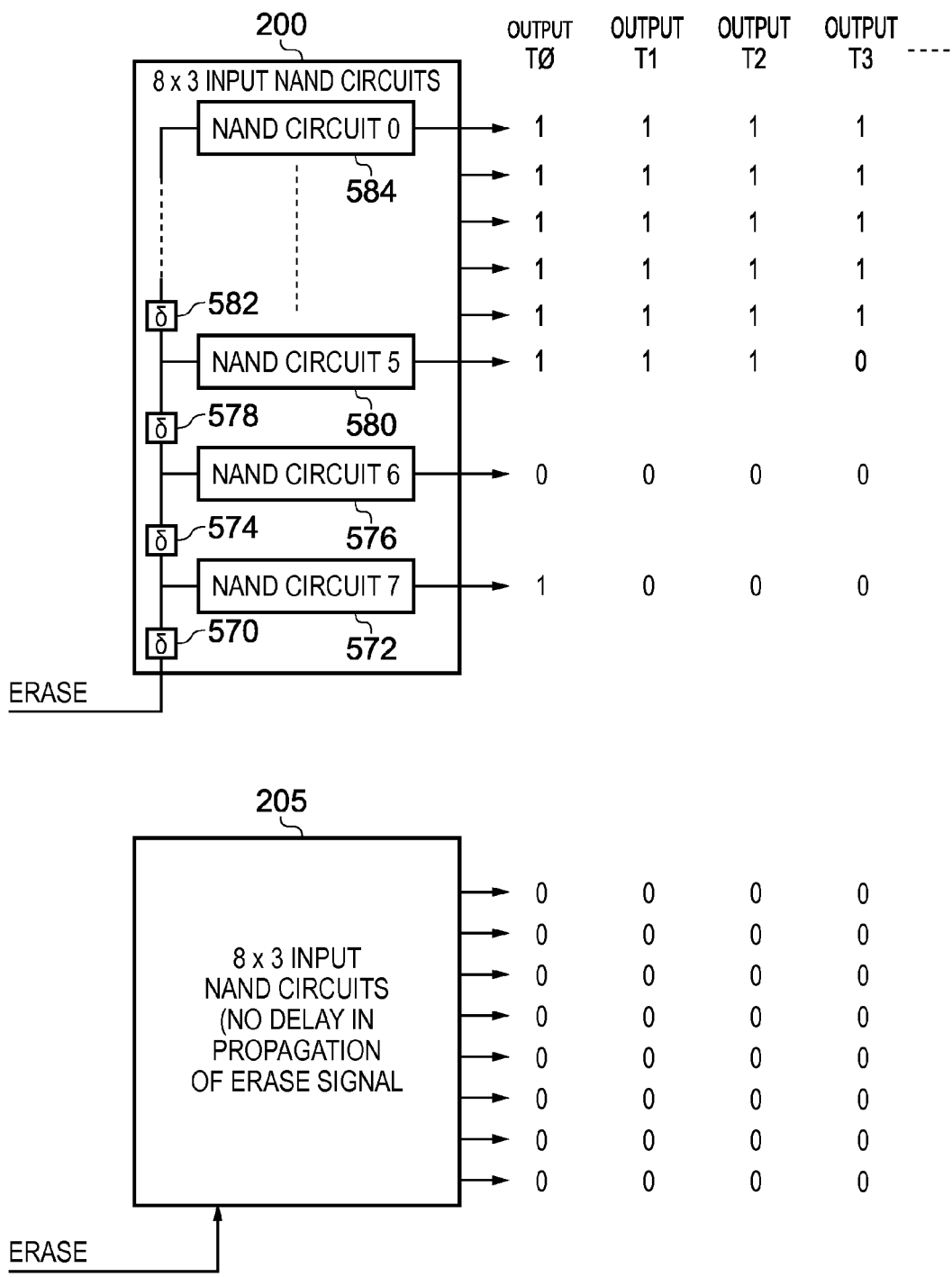
FIG. 7B illustrates in further detail how the delay mechanism of FIG. 7A may be used in one embodiment.

Whilst it is not essential to delay the transmission of the erase signal to the first NMOS transistor 520, an additional benefit can be realised by doing so, as will be illustrated schematically with reference to FIG. 7B. In the example of FIG. 7B, it is assumed that all sixteen intermediate signal generation blocks within the pre-decode circuits 200, 205 are modified as shown in FIG. 4. However, the eight intermediate signal generation blocks within the pre-decode circuitry 205 do not have the erase signal delayed, and accordingly as soon as the erase signal is asserted, the output intermediate signals from those eight blocks transition to a logic zero value.

In contrast, for each of the eight intermediate signal generation blocks 572, 576, 580, 584 within the pre-decode circuit 200, an associated delay element 570, 574, 578, 582 ensures that the propagation of the erase signal is delay differentially before being supplied to each of those blocks. Due to the earlier described operation of the pre-decode circuitry in a normal mode of operation (i.e. where the erase signal is de-asserted), it will always be the case that the output from one of the NAND circuits is at a logic zero value, with the remaining outputs being at a logic one value. However, which one is outputting a logic zero value will depend entirely on the last provided input to the pre-decode circuitry 200. By using the initial delay element 570, advantage can be taken of the fact that one of the outputs is already at a logic zero value to ensure that the number of word lines that are asserted initially is always the same, and a relatively small number. In particular, as shown, at time 0, NAND circuit 6 576 will output a logic zero value but all of the other NAND circuits within the pre-decode circuitry 200 will output a logic one value. Combined with the eight logic zero values output from the pre-decode circuitry 205, this will mean that 32 word lines (i.e. $\frac{1}{8}^{th}$ of the total word lines) will be activated at time 0 for the configuration shown in FIG. 2.

At time 1, it is assumed that NAND circuit 7 572 has now received the asserted erase signal, and accordingly has transitioned its output to a logic zero value. As a result, another 32 word lines will be selected. At time 2, NAND circuit 6 576 receives the asserted erase signal, but since its output was already at a logic zero value, the same 32 word lines will be addressed at that point. However, at time 3, NAND circuit 5 580 will also receive the asserted word line signal, causing a further 32 word lines to be asserted. This process will continue until all of the NAND circuits within the pre-decoder circuitry 200 have received the asserted word line signal, and accordingly have transitioned their intermediate output to a logic zero value, at which time all of the word lines will be asserted.

Such an approach means that the forced write operation used to overwrite the values in the memory array is performed in a staggered manner. This is illustrated schematically in FIG. 8. As shown by the transition 560, without the staggered approach discussed in FIGS. 7A and 7B, all 256 word lines will be asserted at the same time, but the slope will be relatively shallow since it will take significantly longer to drive the word lines to the logic one value. There will also be a significantly large in rush current. In contrast, when using the staggered approach, the word lines transition in blocks of 32, and due to the reduced loading the transition to the asserted value occurs more quickly. This is shown schematically by the series of transitions 565 shown in FIG. 8, and over the course of eight stages all of the word lines will transition to the logic one value. In fact, as discussed earlier with reference to FIG. 7B, there will be one additional redundant stage when the asserted erase signal reaches the NAND circuit that was already outputting a logic zero value, but that level of detail is omitted from FIG. 8 for clarity. Overall, it is found that the staggered approach enables the same result to be achieved in a very similar period of time, but with a much smoother power consumption behaviour than would occur if all of the word lines were asserted at exactly the same time.

Whilst the delay elements are illustrated schematically in FIG. 7A by a series of inverters, it will be appreciated that the delay mechanisms can take a variety of forms, for example an inverter delay or a resistor/capacitor based delay, or a mixture of those delay types.

The steeper word line transitions that occur when using the staggered approach also significantly improve the writeability of the addressed bit cells, ensuring that they flip state more cleanly, without drawing too much cross current. This limits the total power consumption, and also enables the sizing of the components within blocks 450 of FIG. 6 to be reduced.

The granularity of the staggering of the propagation of the erase signal can be varied as desired. The more staggering steps introduced, the smaller the number of word lines asserted at each point in time, and the more smoothly the in rush current will be spread out. However, the more staggering steps introduced, the longer the delay that will be added. However, as the number of staggering steps is increased, this generally reduces the size of the circuits required, and improves the secrecy. It will be appreciated that a balance can be achieved between these various factors for each particular implementation.

Figure 9:
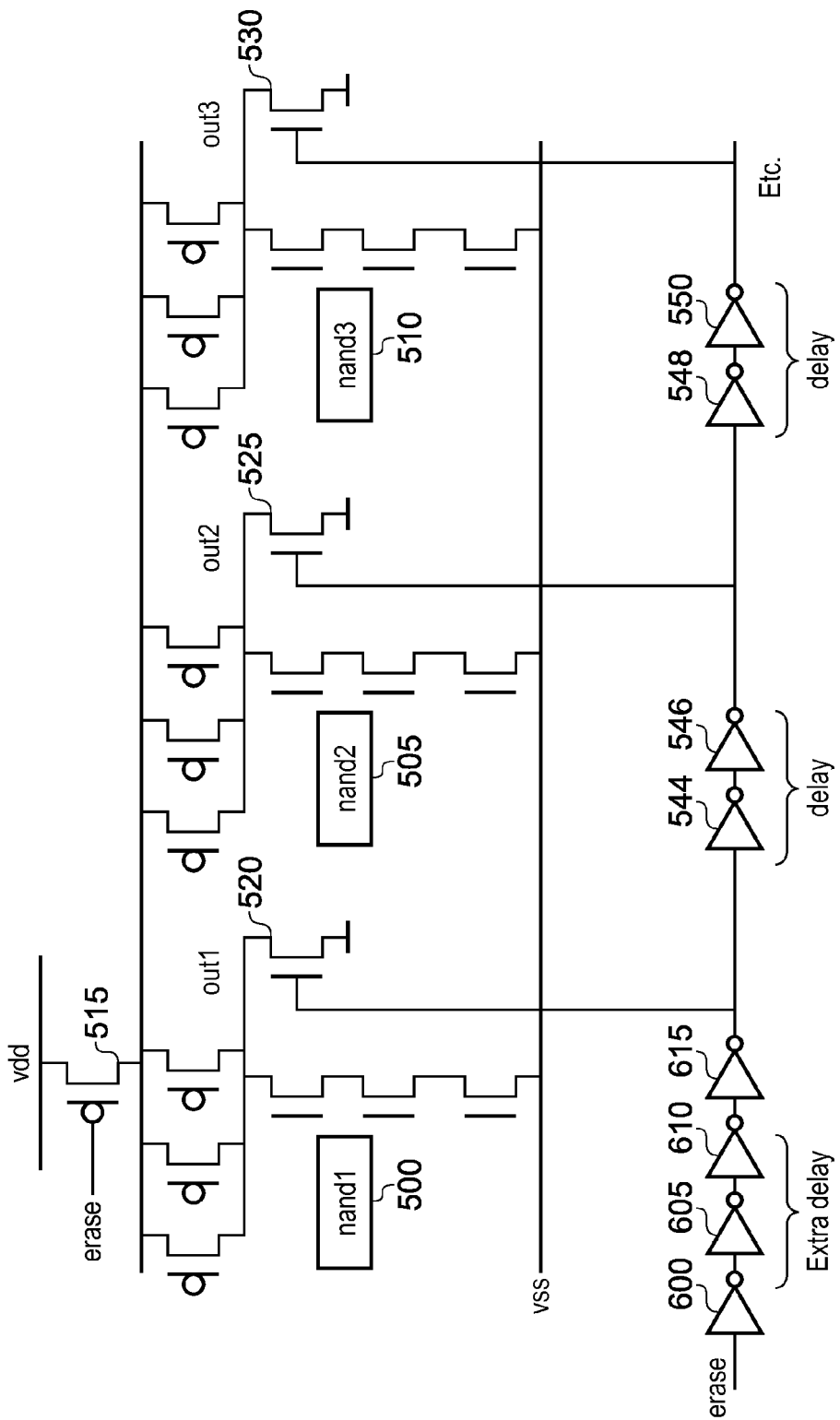
FIG. 9 illustrates a modified version of FIG. 7A, where the length of the initial delay is increased in order to ensure that the forced write operation is completed in respect of a first block of memory cells within the predetermined erase region, prior to the remaining memory cells being subjected to the forced write operation, in order to provide a write assist mechanism in accordance with one embodiment.

In situations where the predetermined erase region is large, then strong write driver circuitry is required in order to be able to potentially overwrite up to all of the bit cells connected to a particular bit line pair. To implement a strong write driver often requires the provision of large transistors, and this can hinder normal operations. In particular the normal read and write operations may be slowed down by the presence of such large transistors. However, in accordance with the approach illustrated in FIG. 9, it is possible to significantly reduce the size of the transistors included within the write driver blocks 450 to manage the erase operation, thus reducing the capacitive load on the bit lines. In particular, by comparing FIG. 9 with the earlier described FIG. 7A, it will be seen that an extra delay (formed by inverters 600, 605, 610, 615) is introduced in the propagation of the erase signal to the first NMOS transistor 520. This extra delay is chosen so that for the first group of asserted word lines the corresponding forced write operation will have completed before the NMOS transistor 520 receives the asserted erase signal, and accordingly before the output signal "output 1" transitions to a logic zero value. As a result, only a relatively small number of the bit cells connected to a bit line are written to initially, and further, by the time the remaining staggering stages take place, those bit cells that have been written to now serve to assist the write driver circuitry in flipping the state of the remaining bit cells connected to the bit line. This hence provides a write assist mechanism, thus enabling the size of the components within the blocks 450 of FIG. 6 to be reduced.

Figure 10:
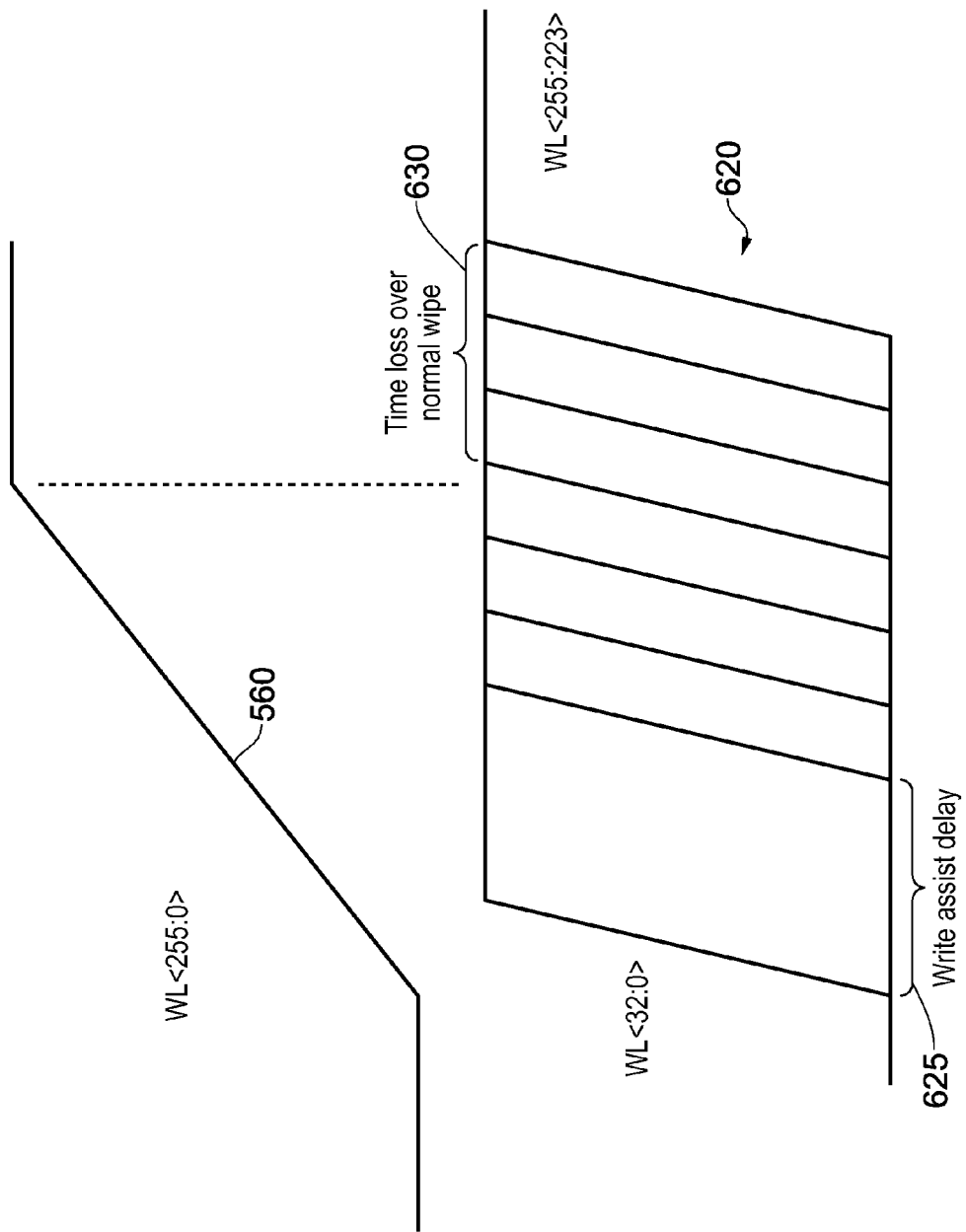
FIG. 10 is a timing diagram illustrating the timing of assertion of the word lines in accordance with one specific embodiment of the approach of FIG. 9.

As shown in FIG. 10, the use of this write assist mechanism introduces an additional delay 630, due to the increased initial propagation delay 625 of the asserted erase signal. However, other than the increased initial delay, the general profile 620 of the asserted word lines is similar to that as discussed earlier with reference to FIG. 8.

Figure 11:
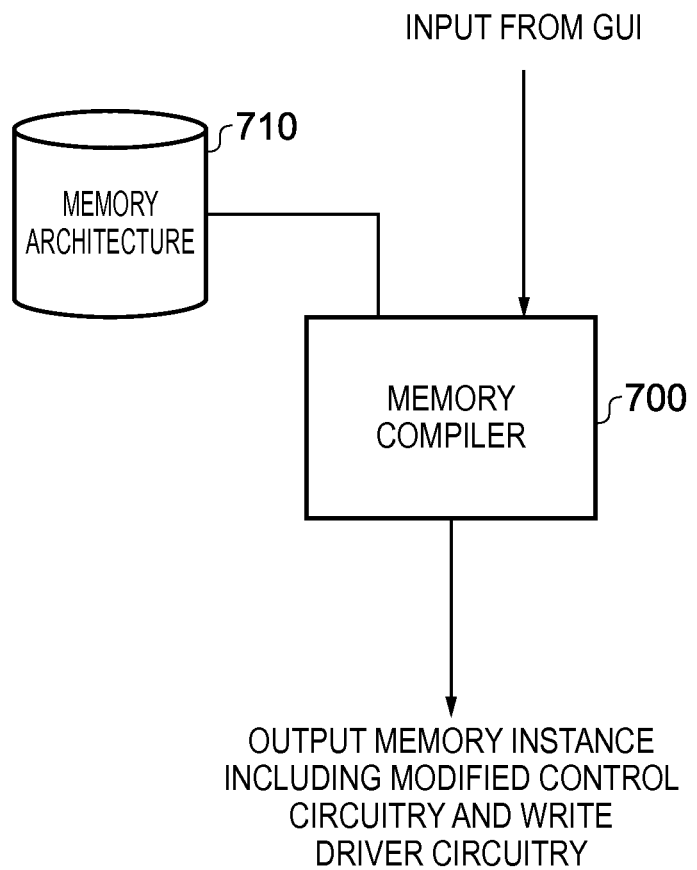
FIG. 11 is a diagram schematically illustrating the operation of a memory compiler to generate a memory instance including modified control circuitry and modified write driver circuitry in accordance with the described embodiments.

FIG. 11 schematically illustrates how a memory instance including modified control (decode) circuitry and write driver circuitry in accordance with the above described embodiments may be created from a memory compiler 700 with reference to a memory architecture 710. The memory architecture 710 specifies a definition of circuit elements and data defining rules for combining those circuit elements in order to create a memory instance. Particular requirements for the memory instance are entered into the memory compiler 700 as input parameters via a graphical user interface (GUI). As will be appreciated by those skilled in the art, such input parameters can specify various aspects of the desired memory instance, for example defining the size of the memory array, the multiplexing arrangements of the memory array, selection of various optional features such as power gating features, built-in-self-test (BIST) modes to be supported, etc.

The memory compiler 700 then generates the required memory instance based on the input parameters and the memory architecture 710. In accordance with one embodiment, the memory compiler includes, in association with the control circuitry and write driver circuitry, additional components to modify the behaviour of those circuits in response to an asserted erase signal, in the manner described with reference to the earlier figures.

Figure 12:
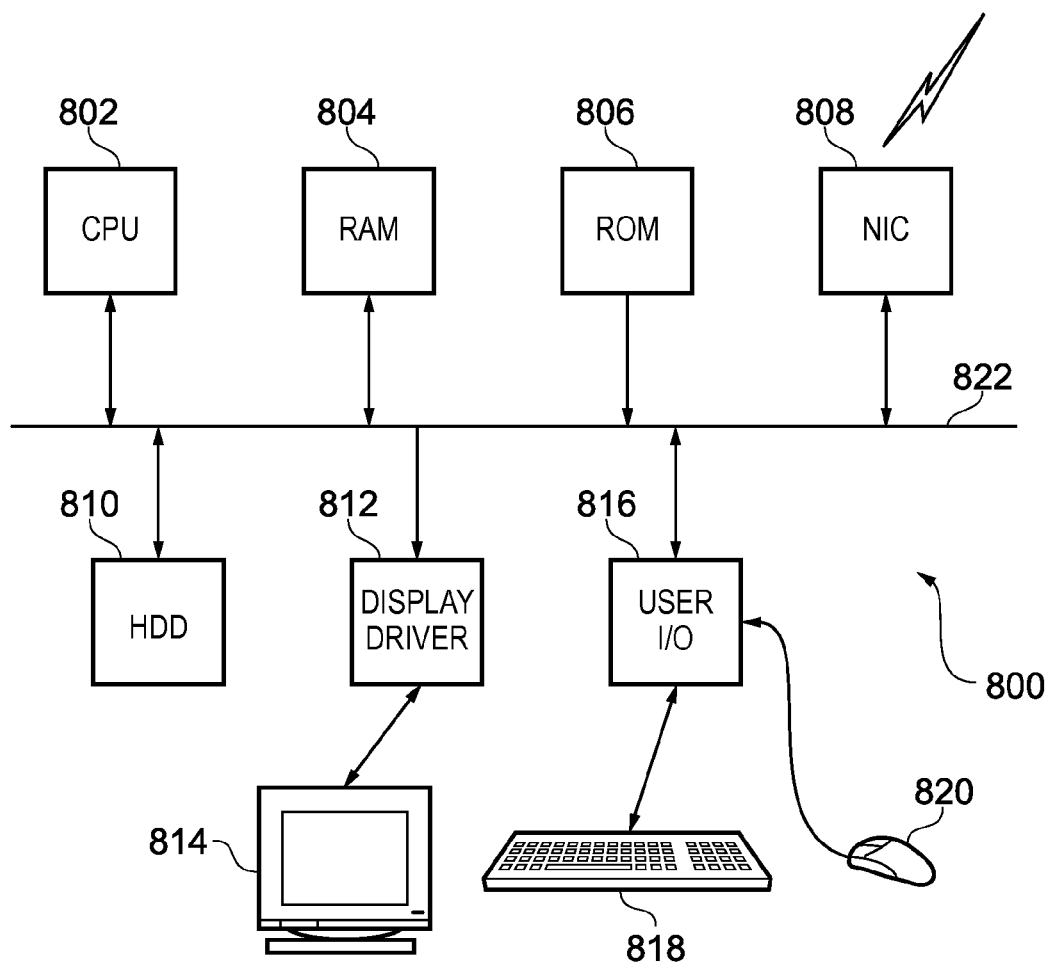
FIG. 12 is a diagram of a computer system on which a memory compiler operation may be performed to generate a memory instance conforming to the above described embodiments.

FIG. 12 schematically illustrates a general purpose computer 800 of the type that may be used to implement the above described memory compilation operation in order to generate a memory instance. The general purpose computer 800 includes a central processing unit 802, a random access memory 804, a read only memory 806, a network interface card 808, a hard disk drive 810, a display driver 812 and monitor 814 and a user input/output circuit 816 with a keyboard 818 and mouse 820 all connected via a common bus 822. In operation the central processing unit 802 will execute computer program instructions that may be stored in one or more of the random access memory 804, the read only memory 806 and the hard disk drive 810 or dynamically downloaded via the network interface card 808. The results of the processing performed may be displayed to a user via the display driver 812 and the monitor 814. User inputs for controlling the operation of the general purpose computer 800 may be received via the user input output circuit 816 from the keyboard 818 or the mouse 820 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 800. When operating under control of an appropriate computer program, the general purpose computer 800 can perform the above described memory compiler operation and can be considered to farm an apparatus for performing the above described memory compiler operation. The architecture of the general purpose computer 800 could vary considerably and FIG. 12 is only one example.

From the above description of embodiments, it will be appreciated that these embodiments provide a particularly efficient and reliable mechanism for erasing an entire memory array, or predetermined portions of it, upon occurrence of a predetermined erase condition. This can be used to significantly improve security of data by avoiding a hacker making use of data remanence effects. Further, the described techniques occur in a clock independent manner, and accordingly even if a hacker were able to remove the clock signal from the memory device the erase process would still be performed and avoid the previously recorded data from being accessed.

Whilst the described techniques have particular application in respect of memory devices that are used to store secure or sensitive data, the techniques can also be applied in any other situations where it is desirable to erase multiple rows of a memory array in a time efficient manner.

Although particular embodiments have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A memory device comprising:
an array of memory cells arranged as a plurality of rows and columns, each row of memory cells being coupled to an associated word line, and each column of memory cells being coupled to an associated at least one bit line;
decoder circuitry configured to be responsive to a write operation to decode an address indication associated with the write operation in order to determine the row containing addressed memory cells for the write operation, and to issue, in dependence on a clock signal, an asserted word line signal on the associated word line for the determined row; and
write circuitry configured to be responsive to said write operation to control a voltage level of the associated at least one bit line for each of said addressed memory cells to cause write data to be written into said addressed memory cells;
the decoder circuitry being configured to be responsive to an asserted erase signal to issue, independently of said clock signal, said asserted word line signal on the word line associated with each row in a predetermined erase region of the array; and
the write circuitry being configured to be responsive to said asserted erase signal to control the voltage level of the associated at least one bit line for each memory cell in said predetermined erase region, in order to cause erase write data to be written into the memory cells of said predetermined erase region;
whereby the memory device is responsive to said asserted erase signal to trigger a forced write operation in respect of each memory cell within said predetermined erase region.

2. A memory device as claimed in claim 1, wherein the decoder circuitry and write circuitry are configured to be responsive to said asserted erase signal independent of a current operating state of the memory device at a time the erase signal is asserted.

3. A memory device as claimed in claim 1, wherein:
said decoder circuitry comprises first stage decoding circuitry configured to generate a plurality of intermediate signals in response to said address indication, and further stage decoding circuitry configured to generate said asserted word line signal in dependence on values of said intermediate signals; and
said decoder circuitry is configured to be responsive to said asserted erase signal to set said intermediate signals to values which will cause the further stage decoding circuitry to then issue said asserted word line signal on the word line associated with each row in said predetermined erase region.

4. A memory device as claimed in claim 3, wherein:
in the absence of said asserted erase signal, timing of operation of said further stage decoding circuitry is controlled by said clock signal; and
the decoder circuitry is responsive to said asserted erase signal to control the timing of operation of said further stage decoding circuitry independently of said clock signal.

5. A memory device as claimed in claim 4, wherein the decoder circuitry comprises:
clock generation circuitry configured, in the absence of said asserted erase signal, to generate an internal clock signal from said clock signal and to provide said internal clock signal to said further stage decoding circuitry;

said clock generation circuitry being responsive to said asserted erase signal to assert the internal clock signal at a predetermined value independent of said clock signal, the further stage decoding circuitry being responsive to the internal clock signal asserted at said predetermined value to generate said asserted word line signal in dependence on the values of said intermediate signals.

6. A memory device as claimed in claim 3, wherein:

said first stage decoding circuitry comprises a plurality of intermediate signal generation blocks, each intermediate signal generation block being configured to receive a plurality of bits derived from the address indication and to generate, in dependence on said plurality of bits, an associated intermediate signal forming one of said plurality of intermediate signals;

in response to said asserted erase signal, at least a subset of said intermediate signal generation blocks being configured to set their intermediate signal to a predetermined value irrespective of the received plurality of bits.

7. A memory device as claimed in claim 6, wherein each intermediate signal generation block is configured, in the absence of said asserted erase signal, to implement a NAND gate function in order to derive said associated intermediate signal from the received plurality of bits; and in response to said asserted erase signal, said at least a subset of said intermediate signal generation blocks are configured to override the NAND gate function in order to set their associated intermediate signal to said predetermined value irrespective of the received plurality of bits.

8. A memory device as claimed in claim 7, wherein each intermediate signal generation block in said at least a subset comprises a first transistor circuit configured to drive an output of that intermediate signal generation block to said predetermined value in the presence of said asserted erase signal.

9. A memory device as claimed in claim 8, wherein multiple intermediate signal generation blocks in said at least a subset share a second transistor circuit configured to decouple those multiple intermediate signal generation blocks from a supply voltage in the presence of said asserted erase signal.

10. A memory device as claimed in claim 1, wherein each column of memory cells is coupled to an associated pair of bit lines; and the write circuitry is configured to be responsive to said asserted erase signal to control the voltage levels on the associated bit line pair for each memory cell in said predetermined erase region, such that for each bit line pair one bit line is at a logic 1 voltage level and the other bit line is at a logic 0 voltage level.

11. A memory device as claimed in claim 1, wherein each column of memory cells is coupled to an associated pair of bit lines; and the write circuitry is configured to be responsive to said asserted erase signal to control the voltage levels on the associated bit line pair for each memory cell in said predetermined erase region, such that for each bit line pair both bit lines are pulled to a voltage level different to a precharged voltage level of the bit lines, in order to cause random data to be written into the memory cells in said predetermined erase region.

12. A memory device as claimed in claim 1, wherein said predetermined erase region comprises one of:

the entire array;

one or more rows of the array; and one or more columns of the array.

13. A memory device as claimed in claim 1, further comprising:

erase activation circuitry responsive to detection of a predetermined event to assert the erase signal to trigger said forced write operation in respect of each memory cell within said predetermined erase region of the array.

14. A memory device as claimed in claim 1, wherein:

said predetermined erase region comprises memory cells occupying multiple rows of said array; and the decoder circuitry is configured to be responsive to said asserted erase signal to treat the word lines associated with said multiple rows as forming a plurality of word line groups, and to stagger in time issuance of said asserted word line signal to the word lines in different word line groups in said plurality of word line groups.

15. A memory device as claimed in claim 14, wherein:

said decoder circuitry comprises first stage decoding circuitry configured to generate a plurality of intermediate signals in response to said address indication, and further stage decoding circuitry configured to generate said asserted word line signal in dependence on values of said intermediate signals;

said decoder circuitry is configured to be responsive to said asserted erase signal to set said intermediate signals to values which will cause the further stage decoding circuitry to then issue said asserted word line signal on the word line associated with each row in said predetermined erase region; and said decoder circuitry is configured to be responsive to said asserted erase signal to stagger in time the setting of said intermediate signals to said values, in order to cause to be staggered in time the issuance of said asserted word line signal to the word lines in different word line groups in said plurality of word line groups.

16. A memory device as claimed in claim 15, wherein:

said first stage decoding circuitry comprises a plurality of intermediate signal generation blocks, each intermediate signal generation block being configured to receive a plurality of bits derived from the address indication and to generate, in dependence on said plurality of bits, an associated intermediate signal forming one of said plurality of intermediate signals;

in response to said asserted erase signal, at least a subset of said intermediate signal generation blocks being configured to set their intermediate signal to a predetermined value irrespective of the received plurality of bits; and the decoder circuitry includes delay circuitry to differentially delay propagation of the asserted erase signal to the intermediate generation blocks in said at least a subset.

17. A memory device as claimed in claim 16, wherein:

said at least a subset of said intermediate signal generation blocks form multiple intermediate signal generation groups; and said delay circuitry is configured to differentially delay propagation of the asserted erase signal to the intermediate signal generation blocks in at least one of said multiple intermediate signal generation groups.

18. A memory device as claimed in claim 17, wherein said delay circuitry is configured to delay propagation of the asserted erase signal to every intermediate signal generation block in said at least one of said multiple intermediate signal generation groups.

19. A memory device as claimed in claim 14, wherein:

the decoder circuitry is configured to issue said asserted word line signal to the word lines in a first word line group and to defer issuance of the asserted word line signal to any further word line groups until the forced write operation has been completed in respect of the memory cells of the predetermined erase region that are associated with the first word line group.

20. A method of operating a memory device comprising an array of memory cells arranged as a plurality of rows and columns, each row of memory cells being coupled to an associated word line, and each column of memory cells being coupled to an associated at least one bit line, the method comprising:
- decoding, in response to a write operation, an address indication associated with the write operation in order to determine the row containing addressed memory cells for the write operation, and issuing, in dependence on a clock signal, an asserted word line signal on the associated word line for the determined row; and
- controlling, in response to said write operation, a voltage level of the associated at least one bit line for each of said addressed memory cells to cause write data to be written into said addressed memory cells;
- modifying the decoding step in response to an asserted erase signal to issue, independently of said clock signal, said asserted word line signal on the word line associated with each row in a predetermined erase region of the array; and
- modifying said controlling step in response to said asserted erase signal to control the voltage level of the associated at least one bit line for each memory cell in said predetermined erase region, in order to cause erase write data to be written into the memory cells of said predetermined erase region;
- whereby the memory device is responsive to said asserted erase signal to trigger a forced write operation in respect of each memory cell within said predetermined erase region.

21. A memory device comprising:
- an array of memory cell means arranged as a plurality of rows and columns, each row of memory cell means being coupled to an associated word line, and each column of memory cell means being coupled to an associated at least one bit line;
- decoder means for decoding, in response to a write operation, an address indication associated with the write operation in order to determine the row containing addressed memory cell means for the write operation, and for issuing, in dependence on a clock signal, an asserted word line signal on the associated word line for the determined row; and
- write means for controlling, in response to said write operation, a voltage level of the associated at least one bit line for each of said addressed memory cell means to cause write data to be written into said addressed memory cell means;
- the decoder means for issuing, in response to an asserted erase signal, and independently of said clock signal, said asserted word line signal on the word line associated with each row in a predetermined erase region of the array; and
- the write means for controlling, in response to said asserted erase signal, the voltage level of the associated at least one bit line for each memory cell means in said predetermined erase region, in order to cause erase write data to be written into the memory cell means of said predetermined erase region;
- whereby the memory device is responsive to said asserted erase signal to trigger a forced write operation in respect of each memory cell means within said predetermined erase region.

22. A computer program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device as claimed in claim 1.

* * * * *